(12) United States Patent
Elmegreen et al.

(10) Patent No.: US 7,848,135 B2
(45) Date of Patent: Dec. 7, 2010

(54) PIEZO-DRIVEN NON-VOLATILE MEMORY CELL WITH HYSTERETIC RESISTANCE

(75) Inventors: Bruce G. Elmegreen, Goldens Bridge, NY (US); Lia Krusin-Elbaum, Dobbs Ferry, NY (US); Xiao Hu Liu, Briarcliff Manor, NY (US); Glenn J. Martyna, Pleasantville, NY (US); Martin Muser, London (CA); Dennis M. Newns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/234,100

(22) Filed: Sep. 19, 2008

(65) Prior Publication Data

US 2010/0073997 A1    Mar. 25, 2010

(51) Int. Cl.
*G11C 11/00* (2006.01)
(52) U.S. Cl. .................. 365/157; 365/163; 365/189.19; 29/25.35
(58) Field of Classification Search ................ 365/157, 365/163, 189.19; 29/25.35
See application file for complete search history.

(56) References Cited

U.S. PATENT DOCUMENTS

| | | | |
|---|---|---|---|
| 5,231,326 A | 7/1993 | Echols | |
| 5,760,675 A | 6/1998 | Lee et al. | |
| 5,872,372 A | 2/1999 | Lee et al. | |
| 5,883,419 A | 3/1999 | Lee et al. | |
| 6,392,934 B1* | 5/2002 | Saluel et al. | 365/189.15 |
| 7,221,579 B2 | 5/2007 | Krusin-Elbaum et al. | |
| 7,394,089 B2 | 7/2008 | Doyle et al. | |
| 7,411,818 B1 | 8/2008 | Elmegreen et al. | |
| 2006/0054926 A1 | 3/2006 | Lahreche | |
| 2007/0235784 A1 | 10/2007 | Krusin-Elbaum et al. | |
| 2009/0026890 A1 | 1/2009 | Goat et al. | |

OTHER PUBLICATIONS

B.S. Kang et al; "Pressure-induced changes in the conductivity of AlGaN/GaN high-electron mobility-transistor membranes," Applied Physics Letters, vol. 85, No. 14, Oct. 4, 2004; pp. 2962-2964.
F.F.C. Duval et al.; "High Frequency PZT Composite Thick Film Resonators;" Integrated Ferroelectrics, 63, 2004; pp. 27-33.

(Continued)

*Primary Examiner*—Hoai V Ho
(74) *Attorney, Agent, or Firm*—Cantor Colburn LLP; Daniel Morris

(57) ABSTRACT

A piezoelectrically programmed, non-volatile memory cell structure includes a programmable piezo-resistive hysteretic material (PRHM) that is capable of being interconverted between a low resistance state and high resistance state through applied pressure cycling thereto; a piezoelectric material mechanically coupled to the PRHM such that an applied voltage across the piezoelectric material results in one of a tensile or compressive stress applied to the PRHM, depending upon the polarity of the applied voltage; and one or more electrodes in electrical communication with the PRHM, wherein the one or more electrodes are configured to provide a write programming current path through the piezoelectric material and a read current path through the PRHM.

24 Claims, 23 Drawing Sheets

OTHER PUBLICATIONS

A. Husmann et al.; "Dynamical Signature of the Mott-Hubbard Transition in Ni(S,Se)2," Science, vol. 274; Dec. 13, 1996; pp. 1874-1876.

A. Jayaraman et al.; "Continuous and Discontinuous Semiconductor-Metal Transition in Samarium Monochalcogenides Under Pressure;" Physical Review Letters, vol. 25, No. 20; Nov. 16, 1970; pp. 1430-1433.

G. Krill et al.; "Physical Properties of Compounds NiS2-xSex with Pyrite Structure: Metal-Non Metal Transition, Evidence of the Existence of an Antiferromaagnetic Metallic Phase;" Journal de Physique, vol. 10, No. 37; Oct. 1976; pp. C4-23-C427.

R. Lengsdorf et al.; "The observation of the insulator-metal transition in EuNio3 under high pressure;" Journal of Physics: Condensed Matter, 16; 2004; pp. 3355-3360.

C. Liu et al.; "Pressure-induced insulator-conductor transition in a photoconducting organic liquid-crystal film," Letter to Nature, vol. 418; Jul. 11, 2002; pp. 162-164.

S.S. Lu et al.; "Piezoelectric field effect transistor (PEFET) using In0.2Ga0.8As/AI0.35/In0.2Ga0.8As/GaAS strained layer structure on (111)B GaAs substrate;" Electronic Letters May 12, 1994 vol. 30 No. 10; pp. 823-825.

S. Sriram et al.; "The effect of post-deposition cooling rate on the orientation of piezoelectric (Pb0.92Sr0.08) (Zr0.65Ti0.35)O3 thin films deposited by RF magnetron sputtering;" Semiconductor Science and Technology 21; 2006; pp. 1236-1243.

S. Tomic et al.; "Pressure-Induced Metal-to-Insulator Phase Transitions in the Organic Conductor (2,5 DM-DCNQI) 2Cu;" Europhysics Letters, 5 (6); Mar. 15, 1988; pp. 553-558.

X. Wang et al.; "Piezoelectric Field Effect Transistor and Nanoforce Sensor Based on a Single ZnO Nanowire;" Nano Letters 2006 vol. 6, No. 12; pp. 2768-2772.

F. Xu et al.; "Longitudinal piezoelectric coefficient measurement for bulk ceramics and thin films using pneumatic pressure rig;" Journal of Applied Physics vol. 86, No. 1, Jul. 1, 1999; pp. 588-594.

Y. Yamashita et al.; "Can relaxor piezoelectric materials outperform PZT?(Review);" IEEE; 1996; 71-78.

A. Yukikuni et al.; "Pressure induced insulator-methal transition in hexagonal BaTi03;" Journal of Physical Society of Japan; 2004; Abstract.

Young-Tae Kim et al; "Study on Cell Characteristics of PRAM Using the Phase-Change Simulation;" IEEE, 2003, pp. 211-214.

Stefan Lai et al; "OUM—A 180 nm Nonvolatile Memory Cell Element Technology for Stand Alone and Embedded Applications;" IEEE, IEDM Tech Digest, 2001, pp. 803-806.

Jon Maimon et al; "Chalcogenide-Based Non-Volatile Memory Technology;" IEEE Aerospace Conf. Proceedings, 2001, pp. 2289-2294.

Scott Tyson et al; "Nonvolatile, High Density, High Performance Phase Change Memory;" IEEE Aerospace Conf. Proceedings, 2001, pp. 385-390.

A. Jayaraman et al.; "Continuous and Discontinous Semiconductor-Metal Transition in Samarium Monochalcogenides Under Pressure;" Physical Review Letters, vol. 25, No. 20, Nov. 16, 1970; pp. 1430-1433.

Sharath Sriram et al.; ARNAM 2007 Annual Workshop Abstract, 2007.

Arturas Ulcinas et al; "Investigation of microstructure and piezoelectric properties of Zr- and Sm- doped PbTiO3 nanostructured thin films derived by sol-gel technology;" Sensors and Actuators B 109, 2005, pp. 97-101.

Maxim Lebedev et al; "Effect of Thickness on the Piezoelectric Properties of Lead Zirconate Titanate Films Fabricated by Aerosol Deposition Method;" Jpn. J. Appl. Phys. vol. 41, 2002, pp. 6669-6673.

C.J. Glassbrenner et al.; "Thermal Conductivity of Silicon and Germanium from 3K to the Melting Point*;" Physical Review, vol. 134, No. 4A, May 18, 1964, pp. A1058-A1069.

S. Sriram et al.; "Measurement of high piezolectric response of stronium-doped lead zirconate thin films using a nanoindenter," Journal of Applied Physics 101, 104910 (2007), pp. 101-105.

* cited by examiner

PIEZO-DRIVEN NON-VOLATILE MEMORY CELL WITH HYSTERETIC RESISTANCE

BACKGROUND

The present invention relates generally to integrated circuit memory devices and, more particularly, to a piezo-driven, low temperature, low power, non-volatile memory cell having hysteretic resistance.

There are numerous contemporary applications where a compact, non-volatile memory with no moving parts would be an enabling technology. Such examples include portable computing and communication devices, computers that use low power, etc. Current techniques for achieving non-volatile memory include magnetic random access memory (MRAM), FLASH, and ferroelectric random access memory (FeRAM). At the present time, the capacities and speeds of these memories in practical devices are comparable with the capacities of dynamic random access memory (DRAM) chips, which is a volatile type of memory that requires continuous power in order to retain the data therein. In addition, DRAM is also relatively slow. Regardless, none of these types of memory described above can compete with the high volumes in disk storage.

A new technology, Phase Change Material (PCM), is now becoming available and is well-suited for non-volatile memory technology. One exemplary phase change material in this regard is a ternary alloy of germanium (Ge), antimony (Sb) and tellurium (Te) (GST), with a typical composition being $Ge_2Sb_2Te_5$, also referred to as GST 225. The GST material is interconvertible between two discrete states, amorphous (high electrical resistance) and crystalline (low electrical resistance), thereby enabling data storage therein. The interconversion or write process for these exemplary materials is done by thermal cycling of the PCM.

However, those types of PCMs (such as GST) that are programmed by internal heating also require a relatively large drive transistor capable of sourcing adequate current/power for the RESET portion of the PCM thermal programming operation. Moreover, such devices are difficult to locate in the back end of line (BEOL) region of a semiconductor device, due to the risk of damage to thermally sensitive low-K materials. In addition, as a result of elemental migration/diffusion at high programming temperatures, the amount of programming cycles that such devices may be subjected to (i.e., its endurance) is somewhat questionable for conventional memory use.

Accordingly, it would be desirable to be able to incorporate PCMs (and more generally, materials having a hysteretic programmable resistance) for non-volatile memory devices in a manner that avoids any disadvantages associated with thermal programming of the materials.

SUMMARY

In an exemplary embodiment, a piezoelectrically programmed, non-volatile memory cell structure includes a programmable piezo-resistive hysteretic material (PRHM) that is capable of being interconverted between a low resistance state and high resistance state through applied pressure cycling thereto; a piezoelectric material mechanically coupled to the PRHM such that an applied voltage across the piezoelectric material results in one of a tensile or compressive stress applied to the PRHM, depending upon the polarity of the applied voltage; and one or more electrodes in electrical communication with the PRHM, wherein the one or more electrodes are configured to provide a write programming current path through the piezoelectric material and a read current path through the PRHM.

In another embodiment, a non-volatile memory array includes a plurality of piezoelectrically programmed, non-volatile memory cells arranged in rows and columns. Each memory cell further includes a programmable piezo-resistive hysteretic material (PRHM) that is capable of being interconverted between a low resistance state and high resistance state through applied pressure cycling thereto; a piezoelectric material mechanically coupled to the PRHM such that an applied voltage across the piezoelectric material results in one of a tensile or compressive stress applied to the PRHM, depending upon the polarity of the applied voltage; and one or more electrodes in electrical communication with the PRHM, wherein the one or more electrodes are configured to provide a write programming current path through the piezoelectric material and a read current path through the PRHM, wherein the piezoelectric material is disposed between a first and a second of the electrodes, the PRHM is disposed between the second and a third of the electrodes, the write programming current path includes the first electrode, the piezoelectric material and the second electrode, and the read current path includes the third electrode, the PRHM and the second electrode. A plurality of read lines is each associated with a column of the array, with each read line coupled to the third electrode of each memory cell in the associated column. A plurality of write lines is each associated with a column of the array, with each write line coupled to the first electrode of each memory cell in the associated column. A plurality of common lines is each associated with a row of the array, with each common line coupled to the second electrode of each memory cell in the associated row.

In another embodiment, a non-volatile memory array includes a plurality of piezoelectrically programmed, non-volatile memory cells arranged in rows and columns, with each memory cell further including a programmable piezo-resistive hysteretic material (PRHM) that is capable of being interconverted between a low resistance state and high resistance state through applied pressure cycling thereto; a piezoelectric material mechanically coupled to the PRHM such that an applied voltage across the piezoelectric material results in one of a tensile or compressive stress applied to the PRHM, depending upon the polarity of the applied voltage; and one or more electrodes in electrical communication with the PRHM, wherein the one or more electrodes are configured to provide a write programming current path through the piezoelectric material and a read current path through the PRHM, wherein the piezoelectric material is disposed between a first and a second of the electrodes, the PRHM is disposed between the second and a third of the electrodes, the write programming current path includes the first electrode, the piezoelectric material and the second electrode, and the read current path includes the third electrode, the PRHM and the second electrode. A plurality of read/write lines is each associated with a column of the array, with each read/write line coupled to the first and third electrodes of each memory cell in the associated column. A plurality of row enable lines is each associated with a row of the array, with each row enable line coupled to the second electrode of each memory cell in the associated row, and a switching transistor is associated with each cell, the switching transistor configured to selectively couple the second electrode of the associated memory cell to ground.

In still another embodiment, a method of forming a piezoelectrically programmed, non-volatile memory cell structure includes forming a piezoelectric material between a first electrode and a second electrode; forming a programmable piezo-resistive hysteretic material (PRHM) between the second electrode and a third electrode, the PRHM capable of being interconverted between a low resistance state and high resistance state through applied pressure cycling thereto; wherein the piezoelectric material is mechanically coupled to the PRHM such that an applied voltage across the piezoelectric material results in one of a tensile or compressive stress applied to the PRHM, depending upon the polarity of the applied voltage; and wherein the first and second electrodes are configured to provide a write programming current path through the piezoelectric material and the second and third electrodes are configured to provide a read current path through the PRHM.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a piezoelectrically programmed, hysteretic memory cell which operates at low temperature, can be located at the BEOL level of an integrated circuit device, requires low power, utilizes only lithographic dimensions, is scalable and supports a large number of programming cycles. Memory arrays utilizing this cell design are also disclosed. As described in further detail herein after, several types of array cell arrangements are contemplated.

A method of interconverting between electrically conducting and electrically insulating forms of material by pressure cycling at low temperature using a piezo element is also disclosed. Conversion using a nanoscopic MEMS device is also possible. The resulting device forms a non-volatile memory cell. Methods for writing and reading this type memory cell are described, as well as a method of fabricating the same.

Piezo-Resistive Hysteretic Materials

Regardless of the specific programming mechanism thereof, a key property of a programmable memory cell material is its ability to coexist in two possible states: one state having a metallic character with a low electrical resistivity, and the other state having a semiconducting character with a high electrical resistivity. As used herein, a "piezo-resistive hysteretic material" (or PRHM for short) generally refers to a material that may be interconverted between a low resistance state and high resistance state through pressure cycling at room temperatures and/or normal IC chip operating temperatures.

One exemplary PRHM material suitable for the present embodiments is a binary alloy of germanium (Ge), and antimony (Sb) having a composition $Ge_{0.15}Sb_{0.85}$. Specifically, this binary material is also known as a phase change material (PCM) since the programmed low resistance state thereof is a result of a change in crystalline structure from an amorphous state to a crystalline state, and the programmed high resistance state thereof is a result of a change in crystalline structure from the crystalline state to the amorphous state. Another exemplary PRHM material suitable for the present embodiments is samarium monosulfide (SmS). However, in addition to the two types of PRHMs specifically discussed herein, other PRHMs with the desired properties described below are also contemplated for use as a piezoelectrically programmed, hysteretic memory cell.

Germanium Antimony

Figure 1:
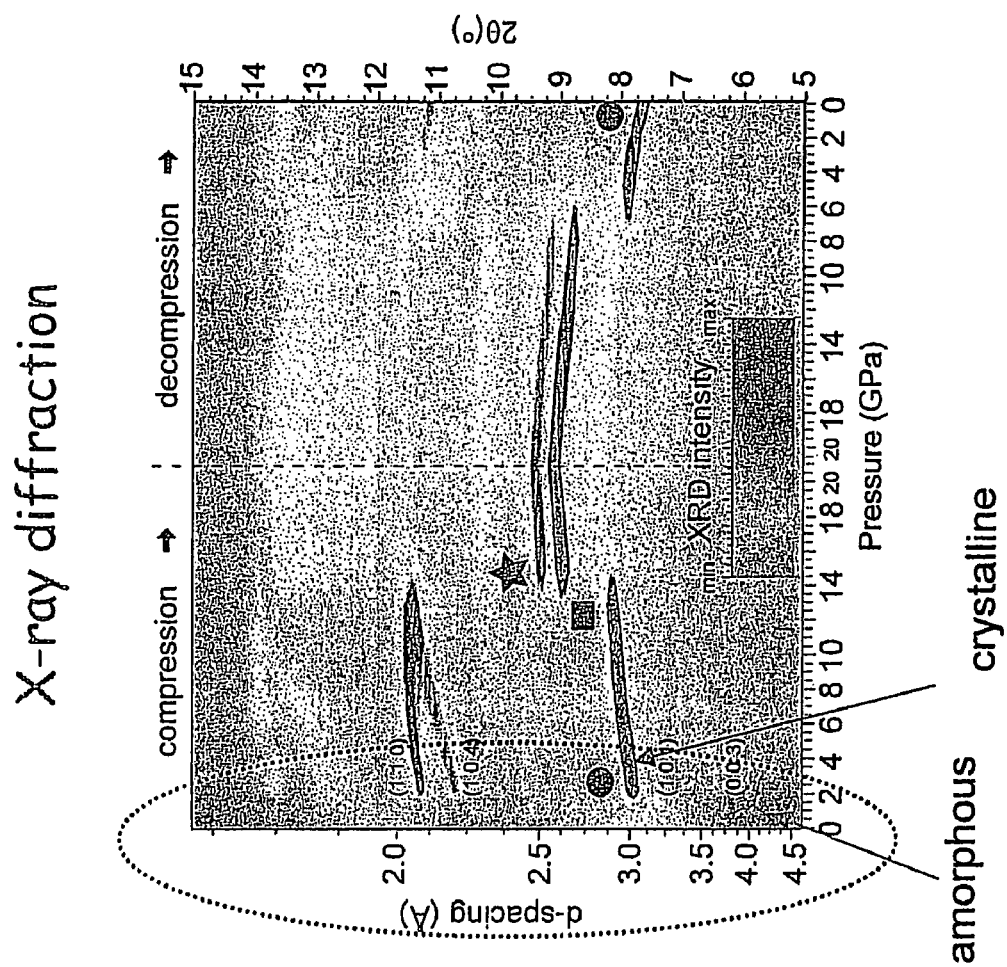
FIG. 1 is an X-ray diffraction graph illustrating the conversion of the amorphous phase of $Ge_{0.15}Sb_{0.85}$ to a crystalline phase at approximately 2 giga Pascals (GPa) of applied pressure.

At moderate temperature and pressure, the $Ge_{0.15}Sb_{0.85}$ PCM can exist in two phases, a crystalline phase which is a moderately good conductor of electricity, and an amorphous phase which is semiconducting. These phases can be interconverted by pressure cycling at room temperature. FIG. 1 is an X-ray diffraction graph, the left portion of which illustrates interplanar distance d as a function of pressure, and specifically demonstrates the conversion of the amorphous phase of $Ge_{0.15}Sb_{0.85}$ to a crystalline phase at approximately 2 giga Pascals (GPa) of pressure. The diffraction pattern of the crystalline phase shows it to be in the A7 structure of crystalline $Ge_{0.15}Sb_{0.85}$.

Figure 2:
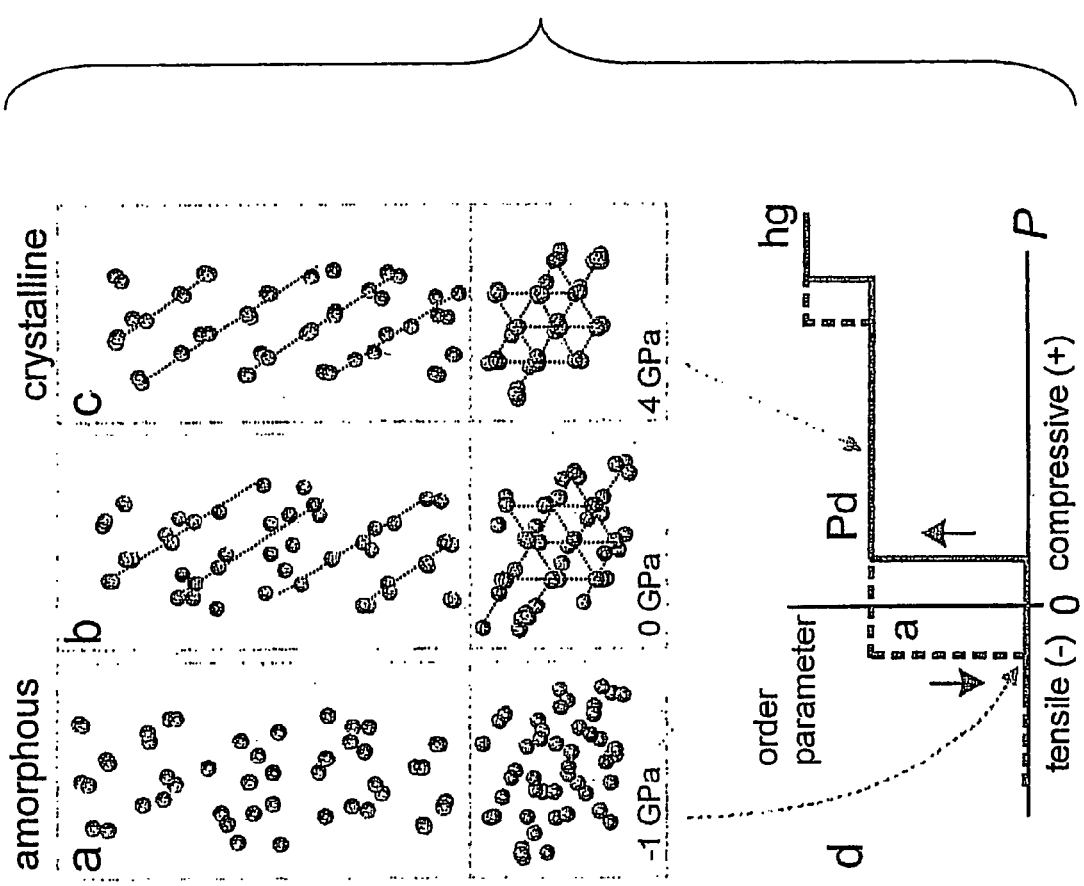
FIGS. 2(a)-(c) illustrate an ab initio (quantum mechanical) simulation of a 48-atom ensemble of $Ge_{0.15}Sb_{0.85}$, which at zero and positive pressures is in the crystalline form, and at a negative pressure is converted to the amorphous form.
FIG. 2(d) is a resistance versus pressure hysteresis diagram of the simulation of FIGS. 2(a)-(c)

FIGS. 2(a)-(c) illustrate an ab initio (quantum mechanical) simulation of a 48-atom ensemble of $Ge_{0.15}Sb_{0.85}$, which at zero and positive pressures is in the crystalline form (FIGS. 2(b), (c)). However, under a negative pressure on the order of about −1 GPa as shown in FIG. 2(a), the crystalline structure is converted to the amorphous, glassy form. The results of FIGS. 2(a)-(c) may be summarized schematically in the hysteresis diagram of FIG. 2(d), which shows that the state of the $Ge_{0.15}Sb_{0.85}$ material at zero applied pressure is history dependent. Therefore, the material may be driven into either of the two stable states, crystalline and amorphous, by pressure cycling. The ON/OFF resistivity ratio for the $Ge_{0.15}Sb_{0.85}$ material is relatively large (e.g., on the order of about 1000 or more). It should be noted that not all PCM materials (e.g., $Ge_2Sb_2Te_5$ or GST) are known to have this strong pressure driven hysteretic resistance property, although they may have smaller pressure sensitivities that could still render them useful for more sensitive applications such as this.

Samarium Monosulfide

Figure 3:
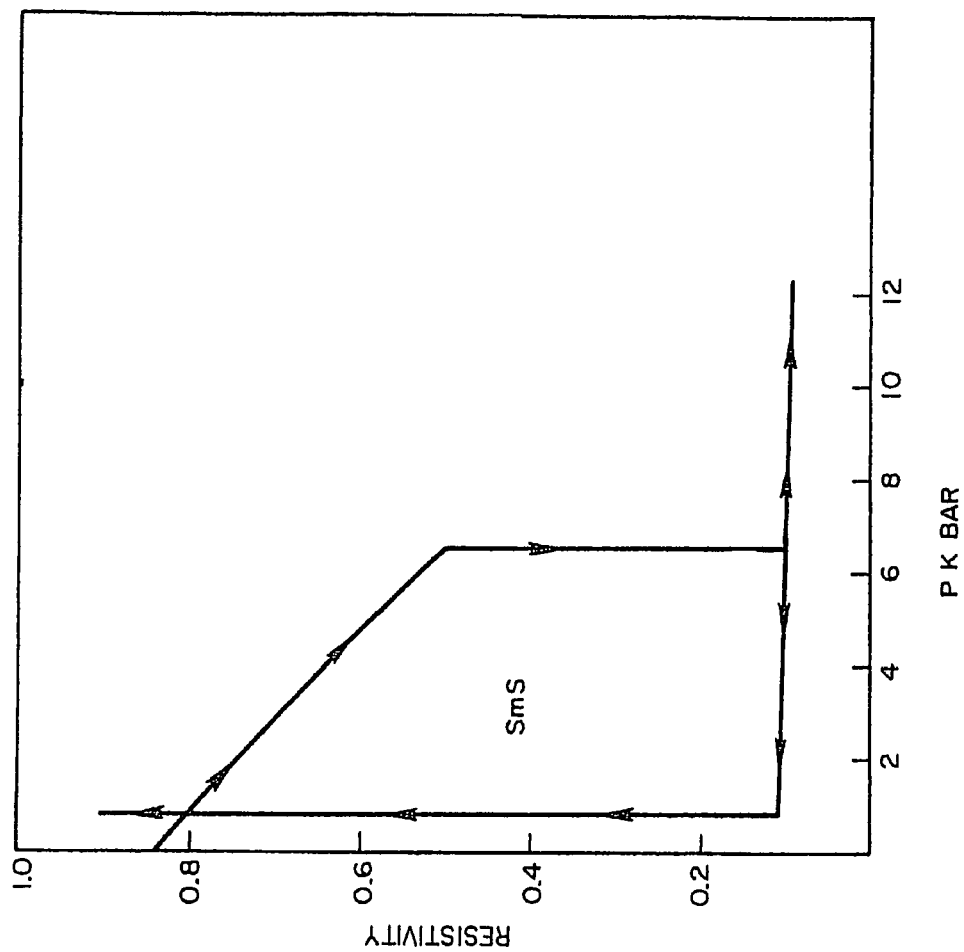
FIG. 3 a resistance versus pressure hysteresis diagram for samarium monosulfide (SmS)

FIG. 3 is a hysteresis diagram for SmS, which has a rocksalt structure. From a resistance versus applied pressure standpoint, SmS is experimentally demonstrated to exhibit a hysteresis loop similar to that of $Ge_{0.15}Sb_{0.85}$ material. However, unlike the GeSb alloy, the SmS material remains in the rocksalt crystalline structure throughout the pressure cycle. Rather, the band structure of the SmS material is characterized by a sulfur (S) 3p valence band and a relatively wide (about 6 eV) samarium (Sm) 5d conduction band. The different conduction states involve different states of the 4f level in each unit cell. In the semiconducting state, the 4f level is in a $4f^6$ filled subshell state and the lattice has relatively high volume. In the metallic state, the 4f shell loses one electron (becoming $4f^5$), donating one electron per unit cell to the 5d band, allowing conduction, while the smaller size of the ionized 4f shell results in a reduced lattice volume. In addition, to function as a PRHM material, an SmS material should be subjected to a bias pressure of about 0.4 GPa, and only requires a pressure swing of about ±0.35 GPa. Although the ON/OFF ratio (on the order of about 7) for the SMS PRHM is relatively low with respect to the GeSb alloy, this is still sufficient to provide a usable (i.e., differentiable) read signal.

Design Requirements and Proposed Solutions

Some of the design requirements for a robust PRHM based, storage class memory include: (1) the device must stably perform the SET (change to low resistance metallic state) and RESET (change to high resistance semiconducting state) operations for a large number of cycles, (e.g., $10^{15}$ or more) and a read capability of the device state must also be provided; (2) power/current requirements should not be excessive; (3) to avoid contamination of silicon components, the PRHM memory layers should be located above the PC (silicon) level; (4) the density of memory units has to be very high, with a large number of them fitting on a chip; and (5) design should be scalable and built using only lithographic dimensions.

With respect to criteria (3), locating the PRHM memory layers at the back end of the line (BEOL) is more desirable. There are constraints resulting from potential damage to the low-K material (e.g., SiCOH) that forms the insulator material in BEOL. Here, the low-temperature pressure-driven memory cell design avoids this problem, which is a serious issue for thermally programmed memory cells, thereby enabling its location at the BEOL level subject to manufacturability.

Basic Single Cell Designs

Figure 4:
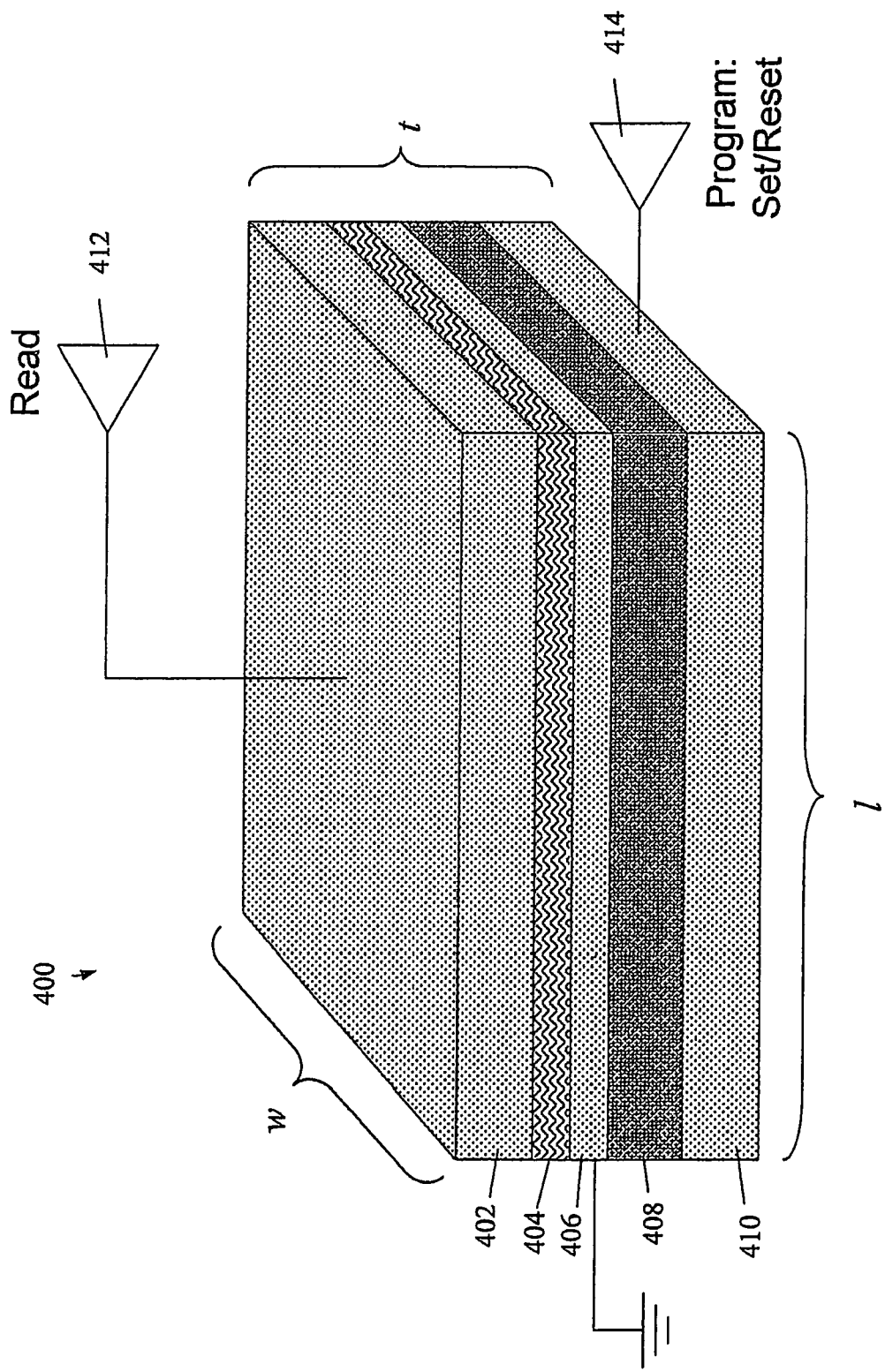
FIG. 4 is a perspective view of a three-terminal, piezo-resistive hysteretic material (PRHM) memory cell structure, in accordance with an embodiment of the invention.

Referring now to FIG. 4, there is shown a perspective view of a three-terminal single-cell PRHM implementation embodied by a 5-layer structure 400. A top metal layer 402 (e.g., about 10-20 nanometers (nm) in thickness) acts as a conductor through which significant current can be passed only if the PRHM is in the conducting state or "on". Below the top metal layer 402 is the PRHM 404 itself, such as discussed above. Below the PRHM layer 404 is a middle, moderately flexible metal layer 406 which acts as a conductive pathway to close the current loop for both sense and program circuits.

As further shown in FIG. 4, below the middle metal layer 406 is a piezoelectric material layer 408 such as, for example, lead-zirconate-titanate (PZT), or strontium-doped lead-zirconate-titanate (PSZT), which has a high piezoelectric coefficient ($d_{33}$) in the range of about 300-600 picometers/volt (pm/V). The piezoelectric material layer 408 is formed on a bottom metal layer 410 that completes the stack. The structure 400 is also shown schematically as a three terminal device in which a read current input is sensed by device 412, wherein the read current path comprises the upper metal layer 402, the PRHM 404 and the middle metal layer 406. In addition, a programming input voltage (the polarity of which depends upon whether the cell is to be SET or RESET) is applied to the piezoelectric material layer 408 through device 414, wherein the programming current path comprises the lower metal layer 410, the piezoelectric material layer 408 and the middle metal layer 406. Thus configured, the structure 400 has an exemplary length, l, of about 45 to about 90 nm, an exemplary width, w, of about 45 to about 90 nm, and an exemplary total thickness, t, of about 35 to about 90 nm, An order of magnitude estimate of the pressure ‑▸P generated by the piezoelectric driver is provided by the formula ‑▸P $\phi Y_{PRHM} d_{33} E_{PE} (L_{PE}/L_{PCM})$, where Y is Young's modulus of the PRHM, E is electric field, and L is film thickness (a more general formula is given hereinafter). Using $Y_{PRHM}$=40 GPa, $d_{33}$=600 pm/V, $E_{PE}$=0.02 V/nm, $L_{PE}$=50 nm, $L_{PCM}$=10 nm, then ‑▸P $\phi$ 2 GPa is achievable. The voltage across the piezo would be about 1.0 V. In a simulation of a preliminary pressure cell design described below, a ‑▸P of about 0.6 GPa was reached (with $d_{33}$=370 pm/V), however it is expected that further mechanical and piezo material optimization will substantially raise this level.

Charging current for the structure may be divided into that required to charge the piezo capacitor and that required to charge the wiring itself. A switching transistor (not shown in FIG. 4) located in each memory cell is only required to charge the piezo element, as the line drive supply charges the wiring. For example, for a device with an in-plane area of 4000 $nm^2$, a piezo thickness 50 nm, and a piezo dielectric constant of 500, the piezo capacitance is approximately 0.4 fF. Some additional, approximately equal, amount needs to be added for contribution to the charge from generating the pressure, yielding around 1 fF. Accordingly, the current requirement will be under 10 μA to charge in about 0.1 ns. This implies that the area of the programming transistor is negligible with respect to a corresponding transistor used for a thermally programmed PCM device.

As indicated above, the pressure cycling of the PRHM cell includes a "RESET" pulse that implements the conversion from the metallic to the semiconducting state by applying a tensile stress to the memory cell for a time $t_1$ during which the PRHM rapidly expands and assumes the semiconducting state. The stress is induced by driving a piezoelectric material in contact with the PRHM memory cell in a "reverse mode." Secondly, the "SET" pulse implements the conversion from the semiconducting state to metallic state by applying a compressive stress to the memory cell for a time $t_2$. The stress is induced by driving the piezoelectric material in contact with the memory cell in a "forward mode."

Figure 5:
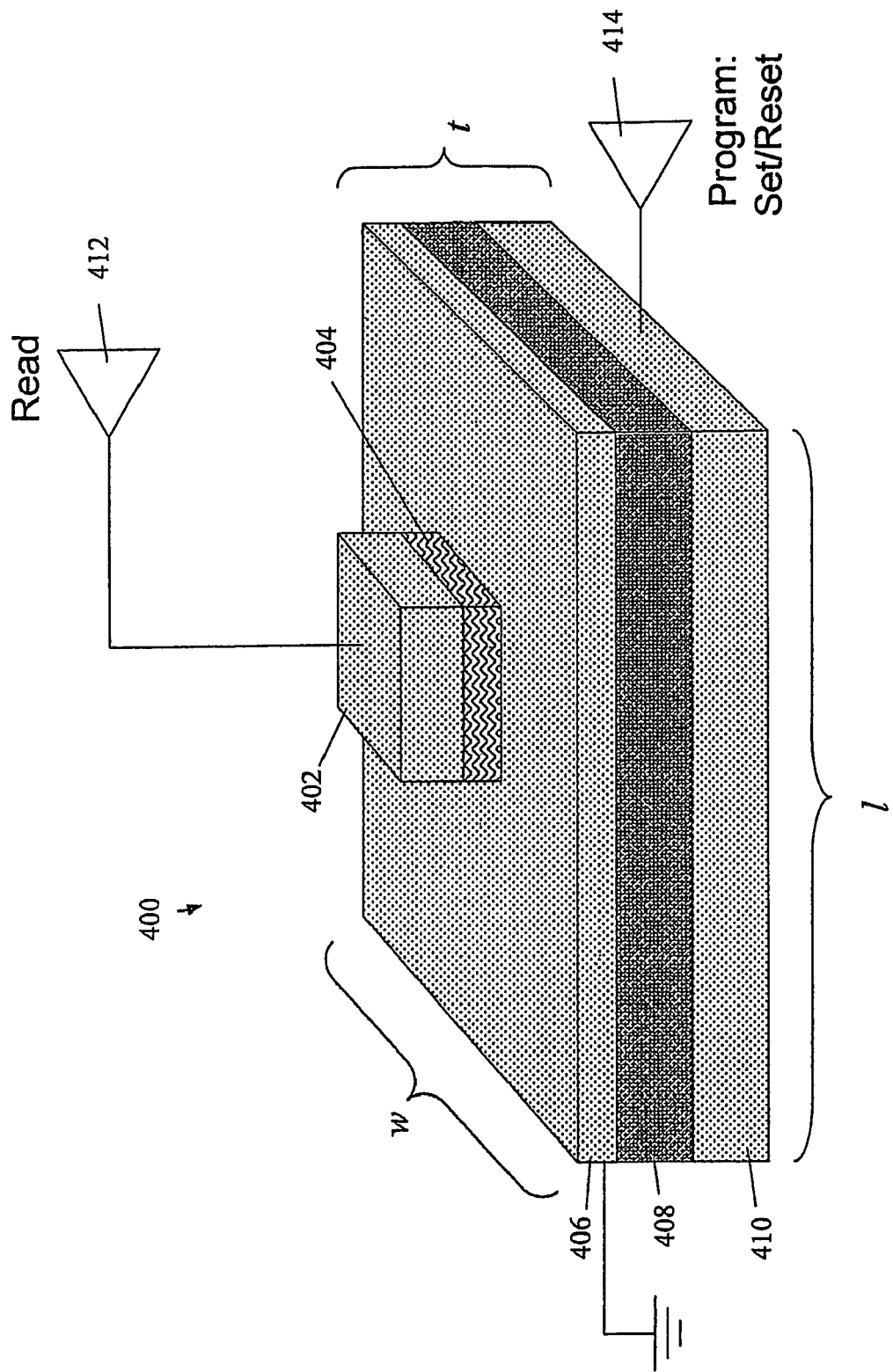
FIG. 5 is an alternative embodiment of the PRHM memory cell structure of FIG. 4.

A modification of the 5-layer, 3-terminal cell structure 400 is shown in FIG. 5. In this embodiment, the PRHM layer 404 has a smaller surface area than the piezoelectric layer 408, thus making the pressure on the PRHM larger than inside the piezo by the ratio of the surface areas. This assumes that the metal layer 406 between the two devices is stiff enough to transmit the piezoelectric force to the PRHM. A pressure gain of a factor of at least 4 should be possible in this manner, relaxing the constraints on the piezoelectric material, currents, and dimensions.

There are several unique and advantageous features of the structure 400. First, it utilizes a PRHM material that can be phase interconverted by application of compressive/tensile stress. Again, one example of such a PRHM material is $Ge_{0.15}Sb_{0.85}$, while another is SmS. Second, the structure 400 does not require heating of the PRHM layer to extreme temperatures (e.g., 800° C.). Thus, the low temperature operating point has the advantage of making the structure 400 BEOL compatible, enhancing bit lifetime, and increasing device endurance. Third, the transistor used to drive the SET/RESET pulses may be much smaller than for a thermally programmed PCM device as the current/power required is not nearly as large. Any concerns with respect to the use of a piezoelectric material with mobile oxygen and undesirable elements may be mitigated by the use of sandwich layers of inert, impermeable metal (described in further detail hereinafter) that act as liners/diffusion barriers, as well as having functional roles in device operation.

Crossbar Memory Array

Figure 6:
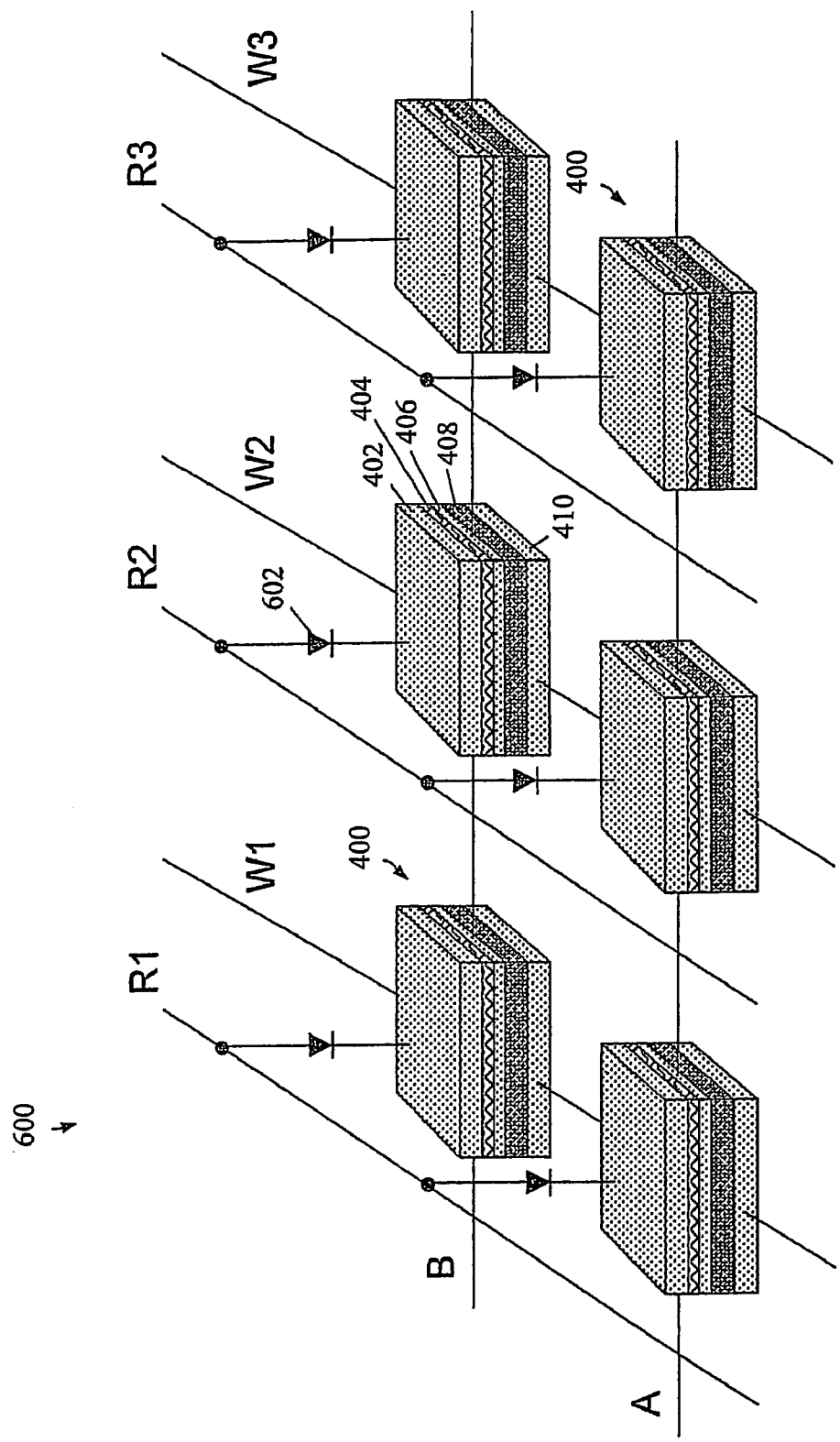
FIG. 6 is a schematic diagram of a simplified crossbar memory array utilizing PRHM memory cell structures, in accordance with a further embodiment of the invention.

Although one example of a practical memory array using a PRHM cell may involve the use of an associated switching FET for each cell, other array configurations are also possible. For example, FIG. 6 is a schematic diagram of a simplified crossbar memory array 600 utilizing PRHM structures 400 discussed above. Each cell structure 400 includes a diode 602 connected between a corresponding read line (R1, R2, R3, etc.) and the upper metal layer 402 of the cell. The bottom metal layer 410 of each cell is coupled to one of the programming or write lines (W1, W2, W3, etc.), while the middle metal layer 406 of each cell is coupled to one of the common lines (A, B, etc.)

The following operational description of the array 600 assumes that the PRHM material has a relatively large ON/OFF resistance ratio (e.g., >30), however similar circuits may be devised to handle materials with somewhat lower ON/OFF resistance ratios.

Figure 7:
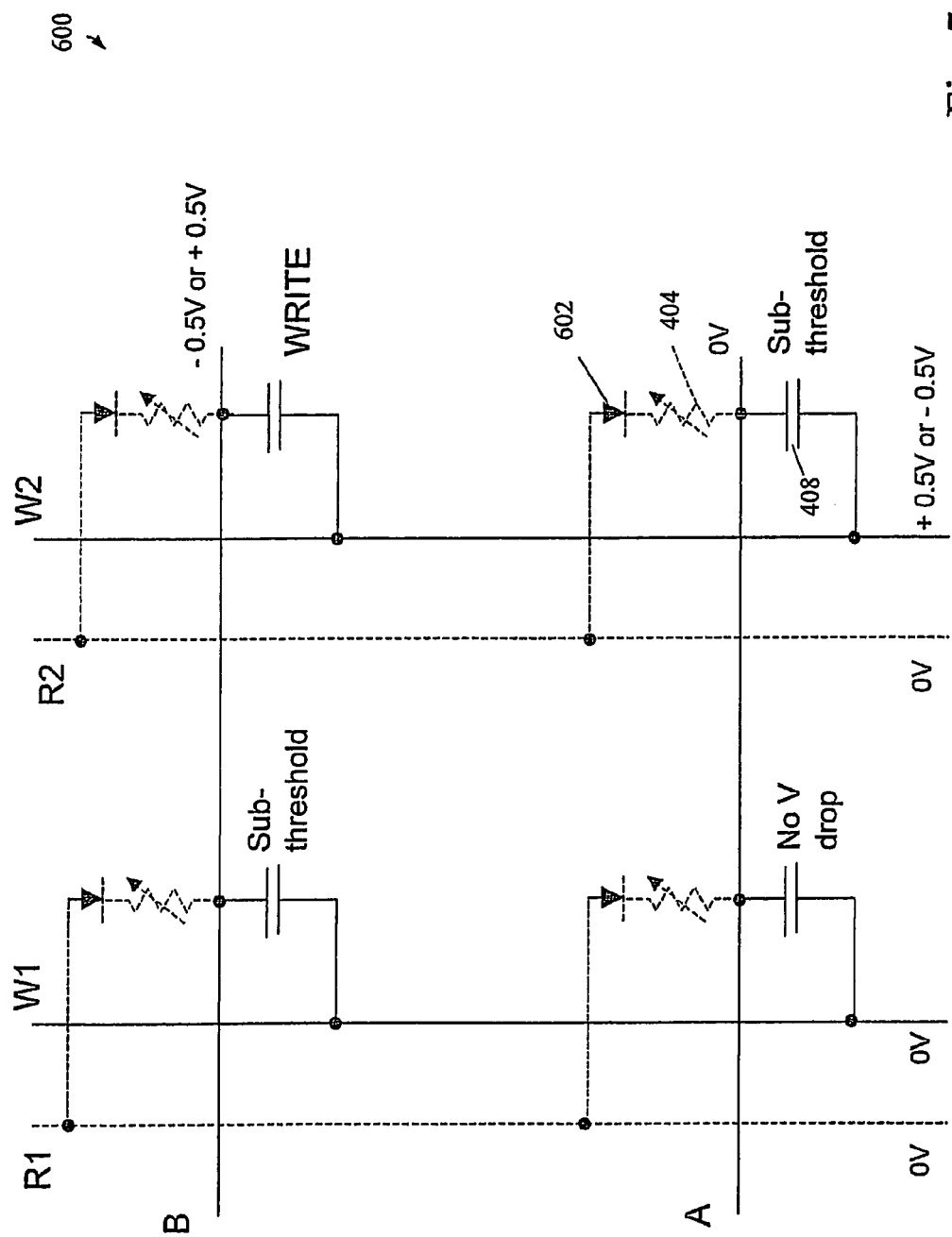
FIG. 7 is a schematic diagram illustrating an exemplary write operation of the crossbar memory array of FIG. 6.
Figure 8:
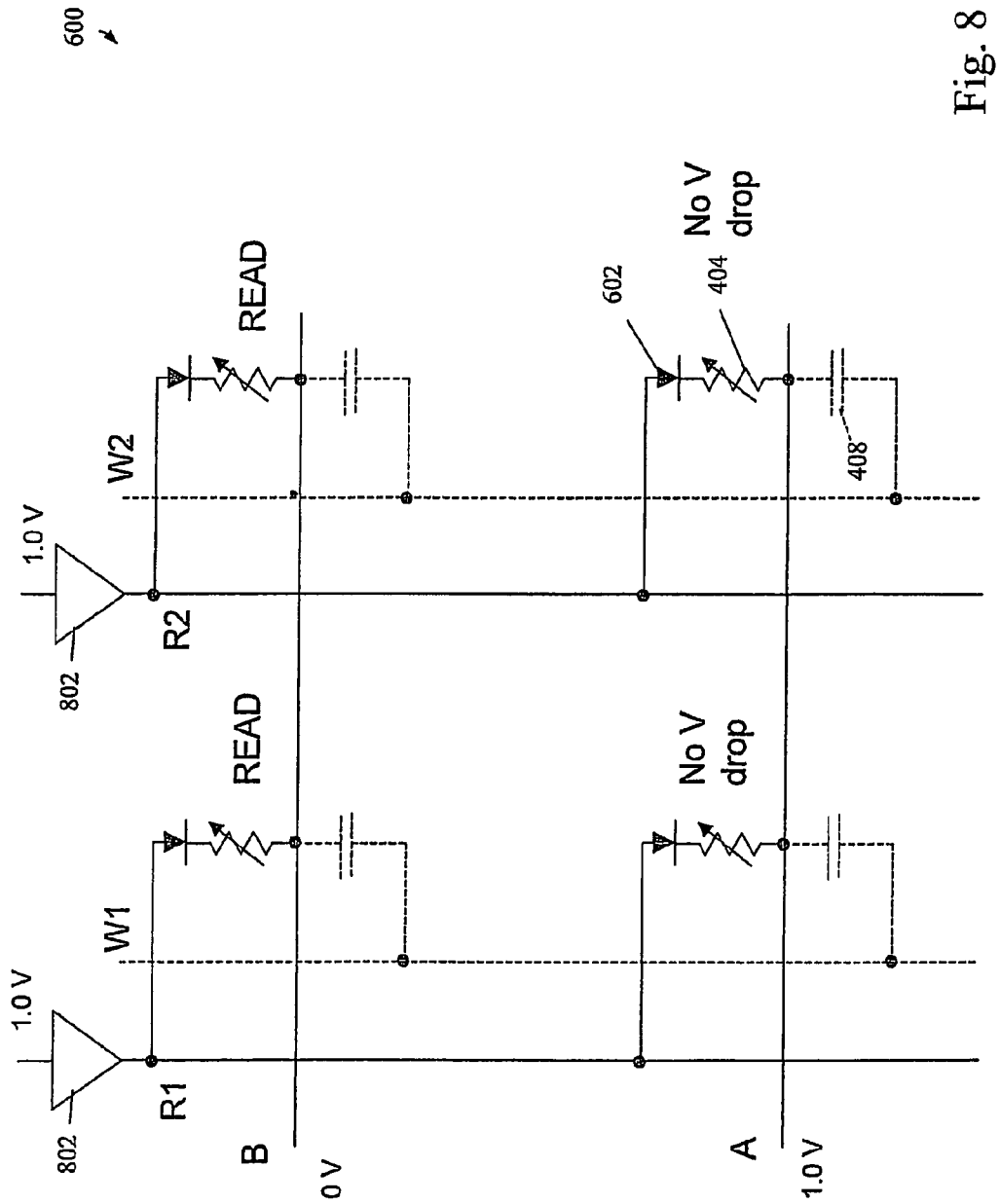
FIG. 8 is a schematic diagram illustrating an exemplary read operation of the crossbar memory array of FIG. 6.

Write and read operations for a crossbar array (such as array 600 in FIG. 6) are schematically illustrated in FIGS. 7 and 8, respectively. In order to write to a particular cell (e.g., cell B2 in FIG. 7), a voltage of a first polarity (e.g., −0.5 V) is applied to the common wire B while a voltage of a second opposite polarity (e.g., +0.5 V) is applied to the write wire W2, the magnitudes of which are both slightly less than the forward diode voltage. The specific polarity of the voltages applied to the selected common and write wires depends on whether the cell is programmed to the high or low resistance states. All other common wires and write wires are grounded, which prevents current conduction through the diode 602 and thus through the PRHM element itself.

Using the voltage examples above, a net voltage of about 1.0 V is thus applied across the piezo element 408. Since the cell design utilizes a particular feature of pressure-induced, non-linear resistance transitions the PRHM does not change its resistive state for small and moderate compressions, but only for pressures beyond a critical compression/tensile load. In the present design example, it is assumed that a write voltage of about 1.0 V across the piezo element will generated the desired resistance switch, while 0.5 V will be considered sub-threshold. Therefore, the half-selected cells (labeled sub-threshold in FIG. 7) are only "half-compressed" and do not switch resistive state, while the single selected cell having 1.0 V applied to its piezo element portion is switched. It will be appreciated, however, that other voltage thresholds may also be used.

In FIG. 8, the read function for crossbar array 600 is illustrated. In order to read the cells of a particular row (e.g., row B in FIG. 8), a positive voltage (e.g., 1.0 V or some power supply voltage value) is applied to all of the read lines (R1, R2, etc.) through corresponding current sensors 802. The write lines (W1, W2, etc.) may be allowed to float. The common line corresponding to the row to be read (B in this example) is grounded, while the remaining common lines are charged to the same potential as the read lines (e.g., 1.0 V). In this manner, read current flows through each cell in row B, while no read current flows through the cells in row A since there is no net voltage across the PRHM element.

In an alternative embodiment, the diodes 602 may be omitted from the crossbar array design altogether since, in the write function, the leakage currents through the selected PRHM elements (in the case of $Ge_{0.15}Sb_{0.85}$ PCM) will typically be insufficient to melt and amorphize the PCM, while the leakage currents through the OFF PCM elements will be too small to anneal them to the ON state. In the read function, the diodes are not needed in the first place. This diode-free embodiment is amenable to multi-layer implementation of the crossbar array with a single silicon substrate, providing the overall coding functionality for the memory.

FET-Based Memory Array

Figure 9:
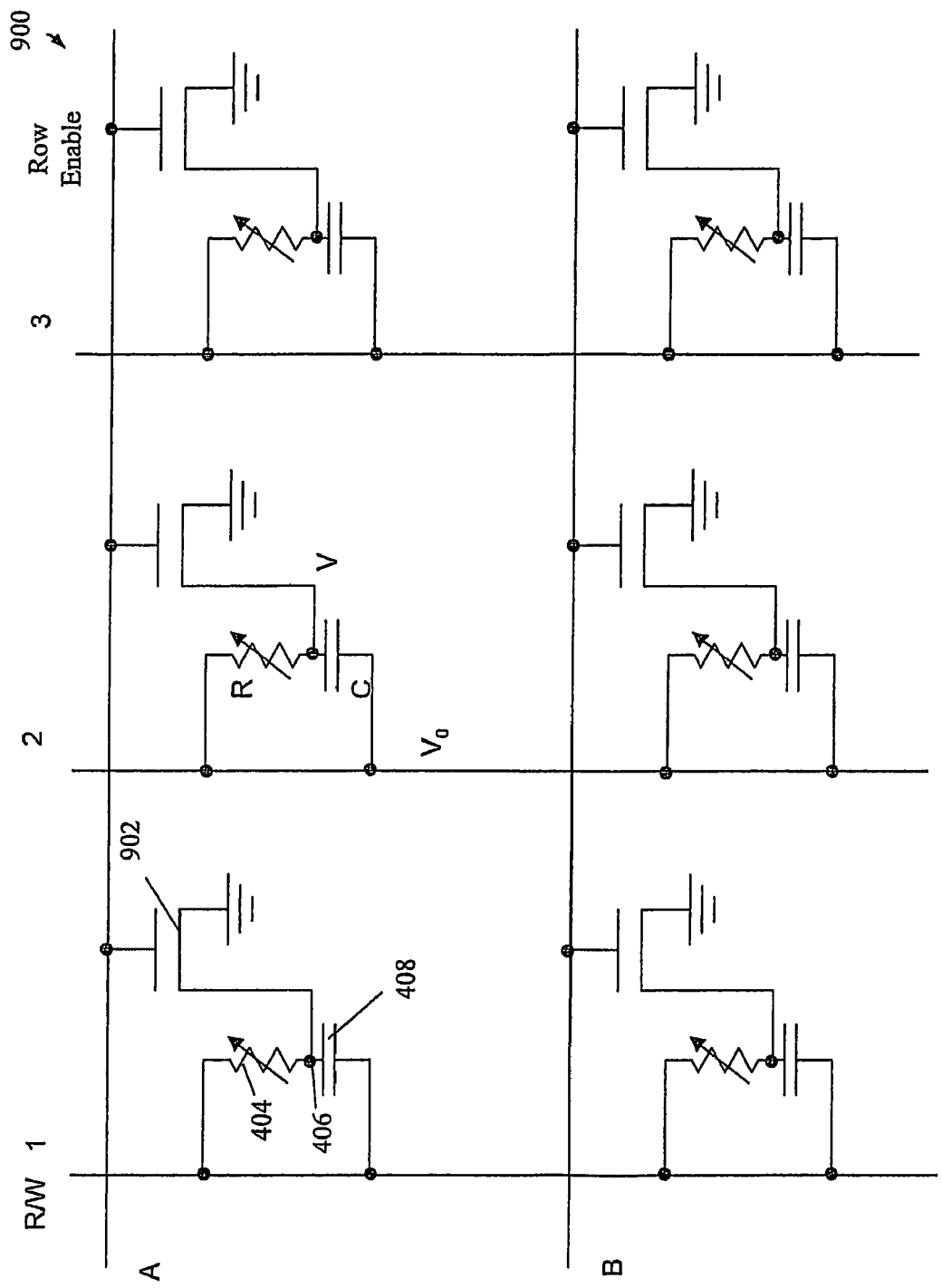
FIG. 9 is a schematic diagram illustrating a simplified FET-based memory array utilizing PRHM memory cell structures, in accordance with a further embodiment of the invention.

Referring now to FIG. 9, there is shown a schematic diagram illustrating a simplified FET-based memory array 900 utilizing PRHM memory cell structures, in accordance with a further embodiment of the invention. In the FET-based design, the middle (common) metal layer 406 of the PRHM cell between the PRHM layer 404 and the piezo layer 408 is selectively coupled to ground through an associated FET 902. The gate terminals of each FET 902 are coupled to a corresponding row enable line (A, B, etc.) of the array 900. In contrast to the crossbar design, both the PRHM and piezo layers are coupled to a dual purpose, read/write (R/W) column line (1, 2, 3, etc.).

To write a given cell, its row enable line is turned on, while a voltage $V_0$, of appropriate polarity and magnitude for the bit to be written, is applied to its column R/W line. Current then flows between the column R/W line and ground through the piezo element 408, the direction of which again depends on whether the voltage applied to the R/W line is positive or negative. To read a given cell, its row enable line is turned on, while a voltage $V_1$, (chosen to lie below the threshold for the write operation), is applied to its column R/W line. The resulting current, after transients have died away, is measured in a current sensor attached to each column line (not shown). A more detailed analysis of the FET-based read and write operations is presented below, as follows:

The piezo capacitance is denoted as C, and the PRHM resistance as is denoted R, where $R=R_{ON}$ or $R_{OFF}$. The cell transistor "ON" drain current characteristic may be modeled as $I=gV(1-V/2V_g)$ ($V[V_g)$, wherein V is drain voltage, the pinch voltage is the gate voltage $V_g$, and g is the low-V conductance at gate voltage $V_g$. The transistor width is taken to be 1 litho line width, (e.g., 40 nm), giving it a saturation current of 40 μA, and with $V_g=1V$, $g=80$ μmho.

Figure 10:
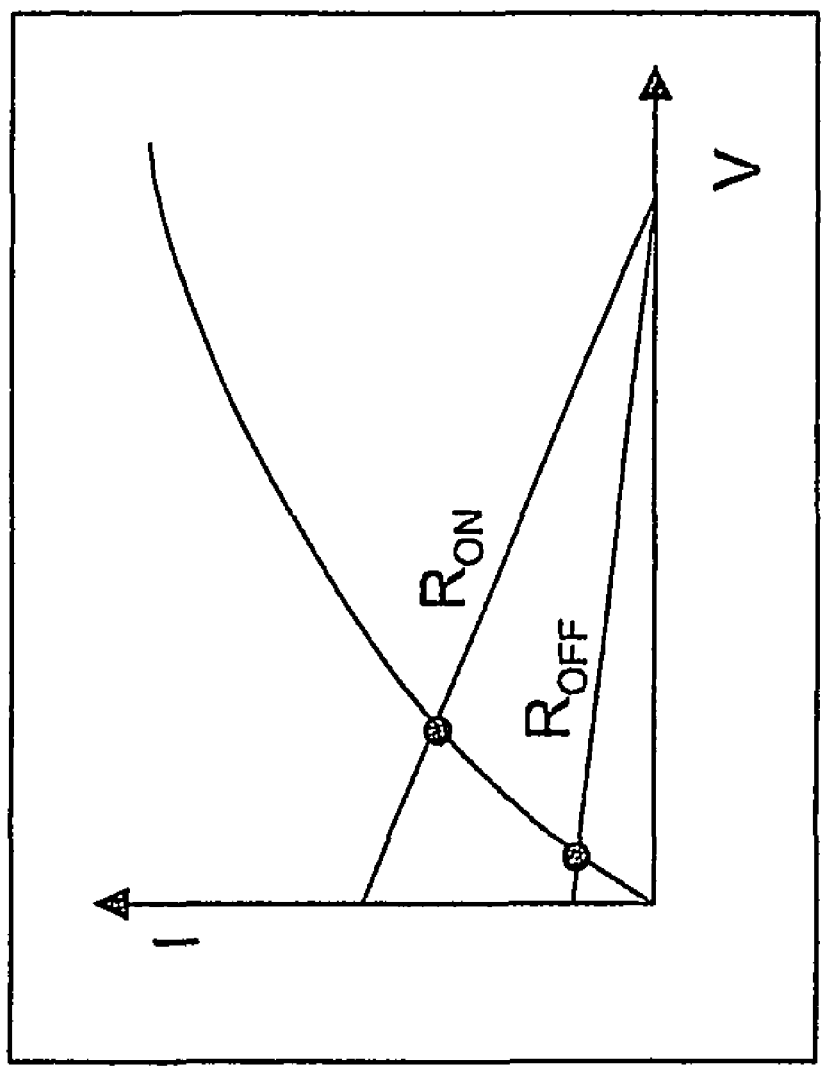
FIG. 10 is a graph illustrating the load line for a write operation of the FET-based memory array of FIG. 9.
Figure 11:
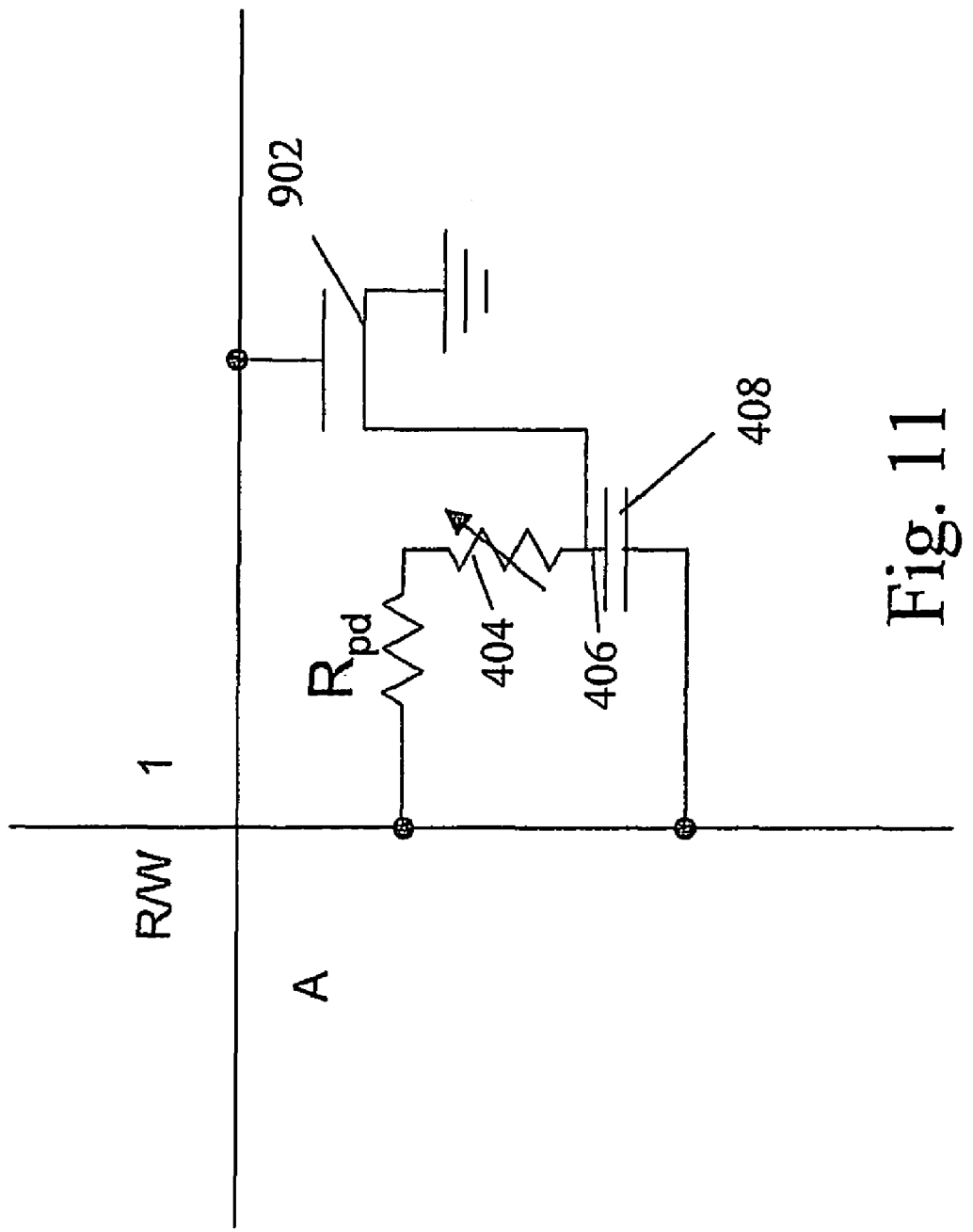
FIG. 11 is a schematic diagram illustrating the use of a pull down resistor in series with the PRHM element in the FET-based memory array of FIG. 9.

The write process requires that the transistor current through the PRHM resistance, R, pull down the drain voltage V well below $V_0$, with the drop $V_0-V$ across the piezo element 408 being the required piezo drive voltage. The load line for the write operation is shown in FIG. 10, assuming operation in the linear portion of the transistor characteristic V=V$_0$/(1+gR). Assuming a piezo voltage of about 70% of V$_0$, this imposes a constraint on the lower value ON resistance, R$_{ON}$, of at least about 30 KΩ. This is a rather large value for R$_{ON}$, which could possibly result in a need to dope the PRHM material to increase its resistivity. Alternatively, it may be desirable to include a pull-down resistor (R$_{pd}$) in series with the PRHM element 404, as shown in FIG. 11. Although the presence of the pulldown resistor will cause some reduction in the ON/OFF ratio for a read operation, this is still adequate because the intrinsic ON/OFF ratio between the two resistance states is still relatively very large. Then, with the larger R$_{OFF}$, the pull-down will be also adequate (as reflected by the load lines in FIG. 11).

During a read operation, the read current for the ON resistance is approximately I$_{ON}$=gV$_1$/(1+gR$_{ON}$)=12 µA (taking V$_1$=0.5 V), while for the OFF resistance it is gV$_1$/(1+gR$_{OFF}$). In practice the ratio, I$_{ON}$/I$_{OFF}$ is close to the ratio R$_{OFF}$/R$_{ON}$; if this is at least 30 (it could be much larger), this gives a reasonable ON/OFF ratio.

The longest time constants are CR$_{OFF}$ and C/g, which are 1.3 ns and 0.02 ns, respectively, for the parameters chosen above. These times are very short and do not limit performance. The lead capacitances are only relevant in the context of the available supply currents, as during operation the leads are connected to the supply (they are not charged by the memory cell as is the case in a DRAM read).

More complex schemes for transistor-switched memory arrays are also viable. For example, with two transistors, one may be placed in the path between C and ground, and the other between R and ground in the example of FIG. 9. Their gates may be connected to a common row enable line, and separate column read and write lines employed, or the common read/write line of FIG. 9 may be used, with the transistors having separate row enable lines for read and write. The resulting circuits tolerate a wider system parameter range than that of FIG. 9, due to the decoupling of read and write. Nevertheless, since only low-current transistors are required, their footprint is reasonably small.

As will be appreciated, there are several advantages of a PRHM based memory array relative to a conventional thermally programmed PCM based array. The programming current required is low, and thus a very small drive transistor is needed, substantially reducing the area per cell. As mentioned above, operation at room temperature and/or nominal chip operating temperatures enables the memory to be located at the BEOL level, whereas thermally programmed cells in the BEOL require thermal insulation to prevent damage to the thermally sensitive low K material. Moreover, low temperature operation should result in much longer endurance. In addition, relative to existing memory technologies, it is contemplated that a multilayer memory is possible using the disclosed cell design. Further, the memory cell footprint may be made at least as "low-area" as existing memory, with such area being scalable with the technology.

Simulation of the Pressure Cell

Figure 12B:
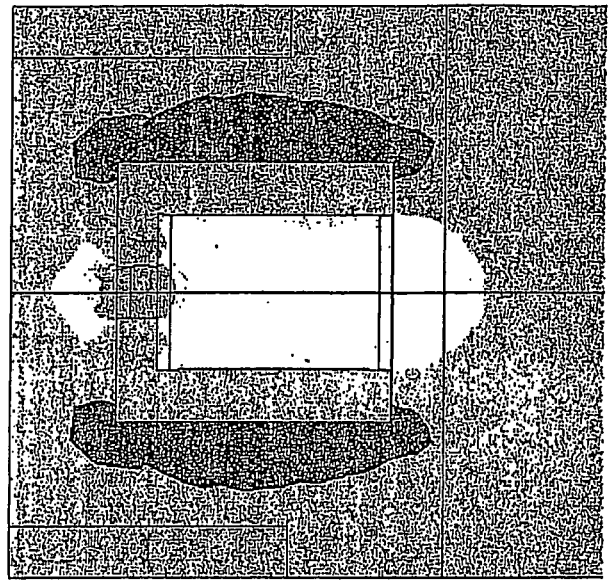
FIGS. 12(a)-(c) illustrate a mechanical software pressure simulation for an exemplary piezo memory cell.
Figure 12A:
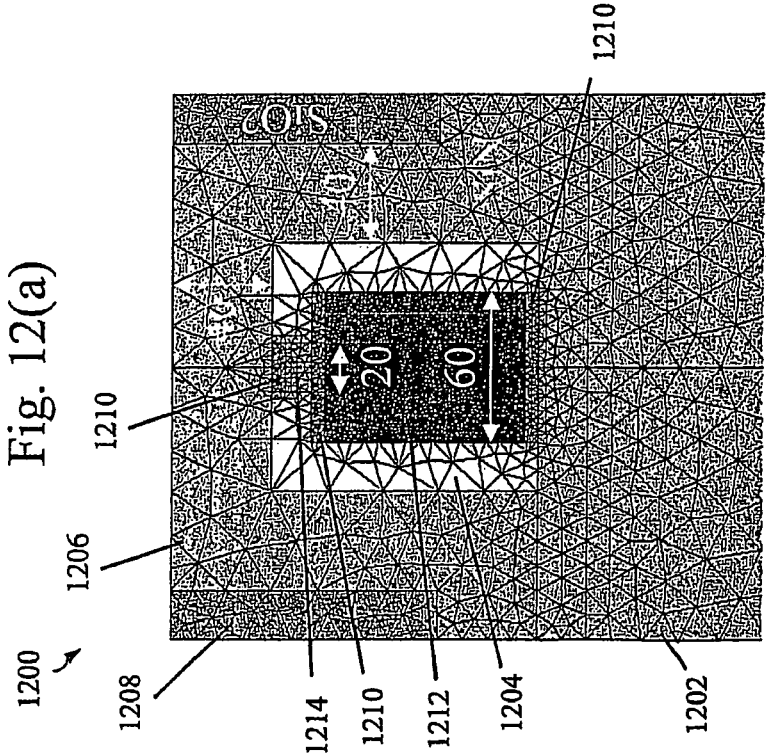

Referring now to FIG. 12(a) there is shown an exemplary piezo memory cell configured for a mechanical simulation, using the engineering simulation software from ANSYS, Inc. Distances shown in FIG. 12(a) are in nanometers. In addition to the 5-layer structure of the memory cell itself (e.g., as shown in FIG. 5), the simulated structure 1200 also includes a silicon substrate 1202, a low-K (e.g., SiCOH or other suitable material having a dielectric constant, κ, of about 4.0 or less) buffer structure 1204 surrounding the cell, a silicon nitride (SiN) clamp or yoke structure 1206 on the substrate 1202 surrounding the memory cell, and silicon dioxide (SiO$_2$) regions 1208 within the SiN clamp structure 1206. The simulation material for the three metal layers 1210 of the cell structure is tungsten (W), and the simulation material for the piezo element 1212 is Lead Zirconate Titanate (PZT-5A).

The nitride clamp structure 1206 forms a rigid frame so that the electrically-induced displacement of the piezo material 1212 is mechanically coupled to (and focused primarily towards) the PRHM 1214. Tungsten forms the necessary conducting electrodes (leads not shown), and is also mechanically rigid, while the low-K buffer structure 1204 (being a soft material) does not impede the operating displacements significantly.

Figure 12C:

FIG. 12(b) shows the stress distribution of the simulated structure 1200 when 1.6 V is applied to the piezo element 1212 with a resulting electric field of 0.02 V/nm. It is noted that a contraction (positive pressure) of the piezo element 1212 results in an expansion (negative pressure) of the PRHM 1214 and vice-versa. It will be seen from FIG. 12(b) that the piezo element 1212 contracts at its sides (due to its Poisson ratio), and exerts pressure at both the top and bottom sides thereof due to its voltage-induced expansion. Due to some degree of force concentration, the highest pressure is in the PRHM 1214, as reflected in FIG. 12(b), and the pressure legend of FIG. 12(c).

Figure 13:
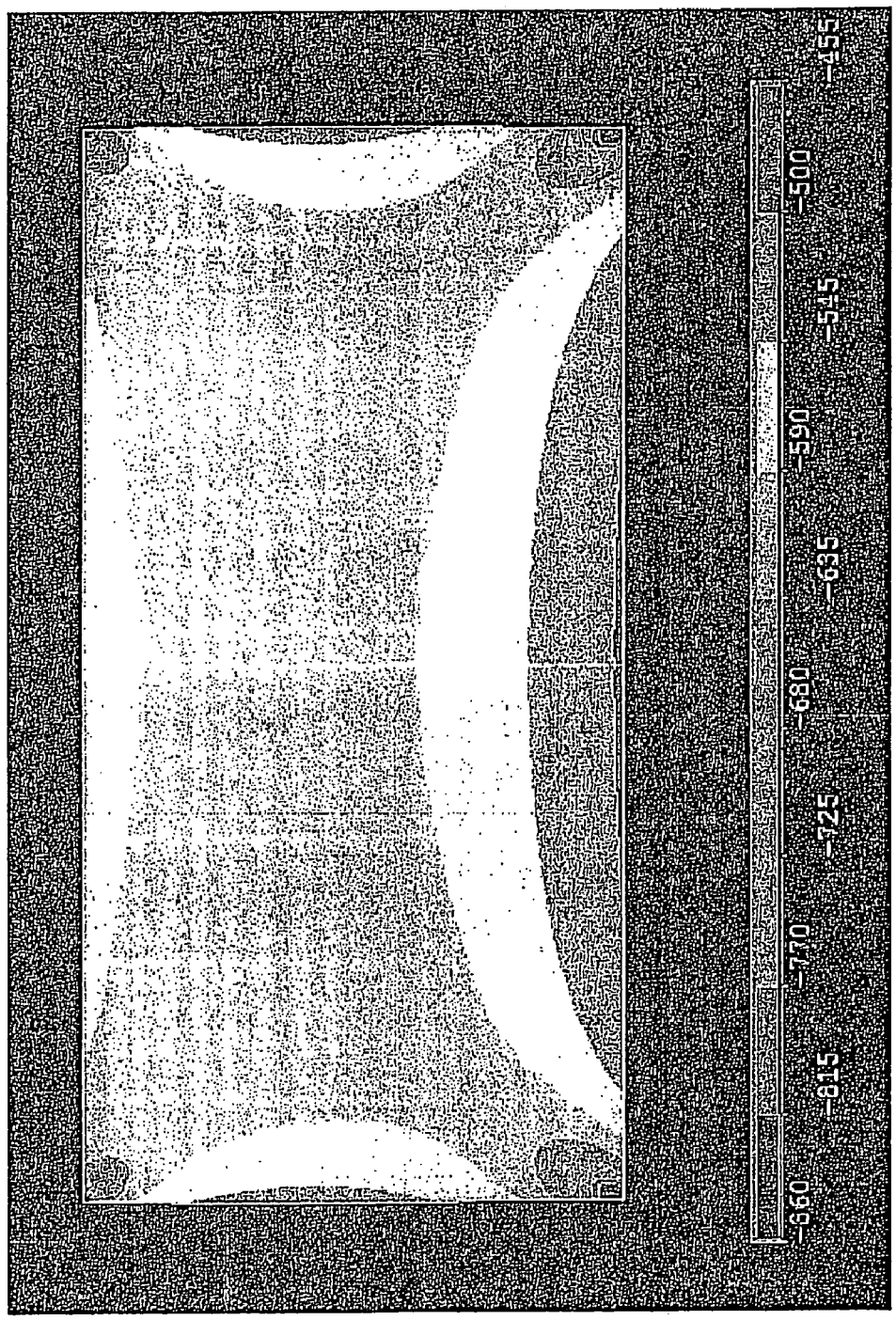
FIG. 13 is a more detailed view of the simulated pressure distribution within the PRHM.
Figure 14:
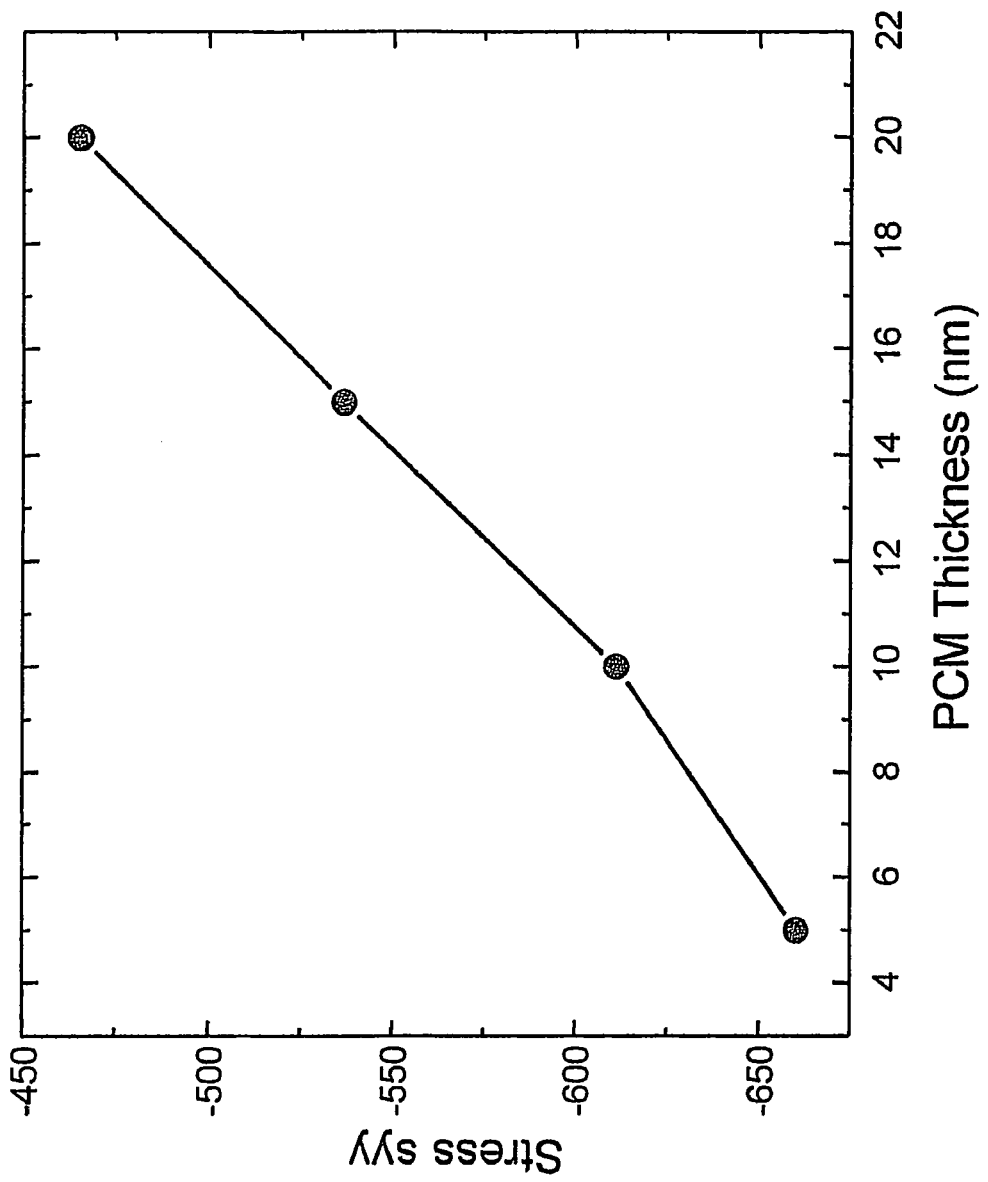
FIG. 14 is a graph illustrating the dependence of pressure on PRHM thickness.

FIG. 13 is a more detailed view of the simulated pressure distribution within the PRHM. As will be noted, the pressure is seen to be fairly uniform therein, and on the order of about 0.6 GPa. FIG. 14 is a graph illustrating the dependence of this pressure on PRHM thickness, which is not critical. The 0.6 GPa pressure would be sufficient, for example, to operate the SmS material (wherein a pressure bias would center the pressure at 0.4 GPa, and pressure swings of ±0.35 GPa would operate the memory).

Figure 15B:
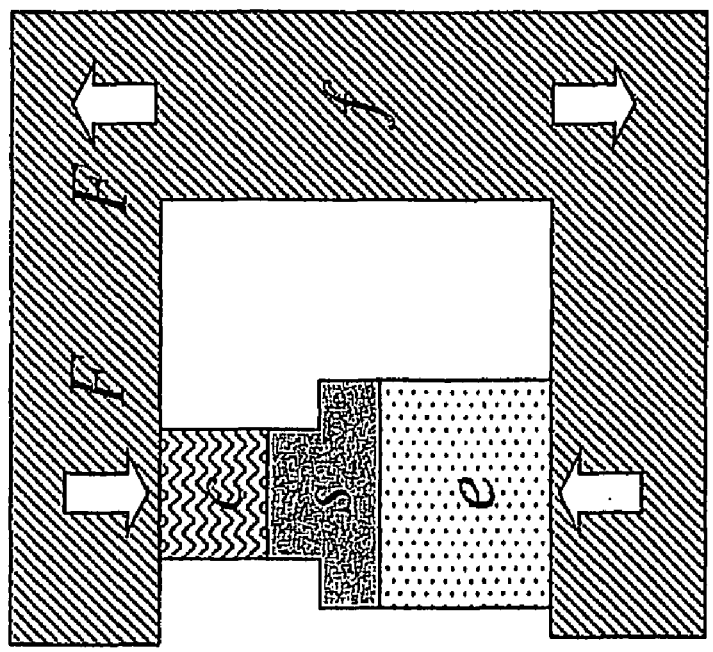
FIGS. 15(a) and 15(b) are cross sectional views illustrating a mechanical model of a clamping structure used to couple piezo-generated stress to the PRHM layer.
Figure 15A:
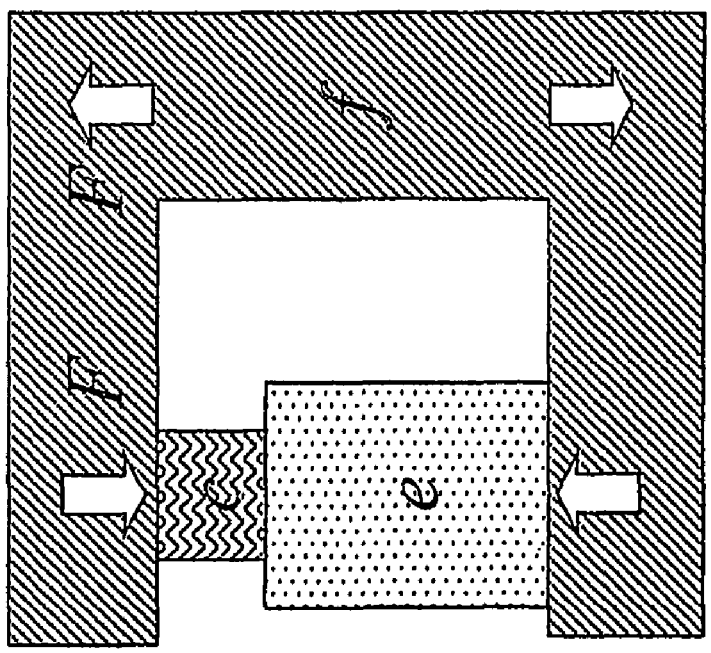

With respect to a clamping structure used to couple piezo-generated stress to the PRHM layer, a simple mechanical model which aids in understanding of the operation of the pressure cell is shown in FIG. 15(a). The model only considers compressive stresses/strains. The parameters for the model include: F=force, L=length, A=area, Y=Young's modulus, u=displacement, k=stiffness, E=electric field, and σ=stress. Coefficients/subscripts used in the model include: f=frame/clamp, c=PRHM, e=(piezo element). The mechanics of a C-shaped clamp as shown in FIG. 15(a) are in accordance with the following expressions:

$$F = \sigma A = \frac{YA}{L} u \quad \text{(Eq. 1)}$$

$$k = \frac{F}{u} = \frac{YA}{L} \quad \text{(Eq. 2)}$$

$$d_{33} E_3 L_e = u_e + u_c + u_f \quad \text{(Eq. 3)}$$

$$\sigma_c = \frac{F}{A_c} = \frac{d_{33} E_3 L_e}{A_c (k_e^{-1} + k_c^{-1} + k_f^{-1})} = \frac{d_{33} E_3}{\frac{1}{Y_e}\frac{A_c}{A_e} + \frac{1}{Y_c}\frac{L_c}{L_e} + \frac{1}{Y_f}\frac{L_f}{L_e}\frac{A_c}{A_f}} \quad \text{(Eq. 4)}$$

If the second two terms in the denominator of the expression of Eq. 4 for the strain σ$_c$ in the PRHM can be for the moment ignored, then the pressure in the PRHM would be multiplied by the ratio of the areas A$_e$/A$_c$ of the piezo to the PCM, the force concentrator effect described above. The second term describes the relative mechanical response of the piezo and PRHM elements, and the third the effect of the mechanical response of the environment (modeled as a C-clamp). There is a bending effect in the horizontal arms of the clamp, which is ignored here. In order to achieve high strain in the PRHM (strain is a dimensionless measure of the ability to drive a phase transition), it is desirable that the PRHM be soft relative to the piezo and environment, that the concentrator area ratio $A_e/A_c$ be large, that the piezo be thicker than the PCM, and that the environment have a "robust" aspect ratio (wider vs. taller), while the sample be the reverse (taller vs. wider). FIG. 15(b) illustrates a similar analysis, only with the insertion of a hard (e.g., tungsten) T-shaped force concentrator(s) between the piezo element and the PRHM. This type of structure may be desirable in the event that the force concentrator area ratio is so large as to risk significant bending distortion in the driver structure. In this example, the applies stress to the PRHM is in accordance with the following expression:

$$\sigma_c = \frac{F}{A_c} \quad \text{(Eq. 5)}$$

$$= \frac{d_{33}E_3L_e}{A_c(k_e^{-1}+k_c^{-1}+k_f^{-1}+k_s^{-1})}$$

$$= \frac{d_{33}E_3}{\frac{1}{Y_e}\frac{A_c}{A_e}+\frac{1}{Y_c}\frac{L_c}{L_e}+\frac{1}{Y_f}\frac{L_f}{L_e}\frac{A_c}{A_f}+\frac{A_c}{L_e}\frac{1}{k_s}}$$

Thus, to maximize the stress in the PRHM, the force concentrator(s) is made stiff, the PRHM is made small and/or the piezo element is made large.

Manufacture

Figure 16A:
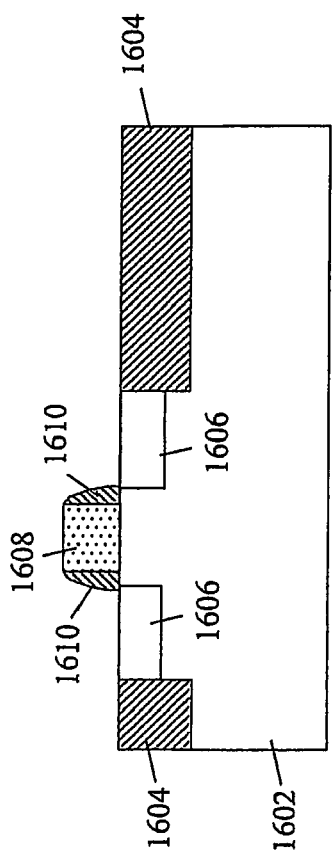
FIGS. 16(a) through 16(k) are cross sectional views illustrating an exemplary method of forming the PRHM memory cell structure of FIG. 5.

Referring now to FIGS. 16(a) through 16(k), there are shown cross sectional views illustrating an exemplary method of forming a PRHM based, storage class memory that is compatible with standard CMOS processing techniques. One skilled in the art will recognize from FIG. 16(a) device processing at the front end of line (FEOL), which shows a substrate 1602 (e.g., silicon, silicon germanium, silicon-on-insulator, etc.), shallow trench isolation (STI) regions 1604 (e.g., oxide) formed in the substrate 1602, and an FET formed between the STI regions 1604. The FET includes doped source/drain regions 1606, a gate conductor 1608 (e.g., doped polysilicon) formed over the substrate between the source/drain regions 1606. A gate insulator layer (not shown) is disposed between the gate conductor 1606 and the substrate 1602 as is known in the art. In addition, the gate conductor 1606 includes sidewall spacers 1610 (e.g., nitride) formed adjacent thereto for proper doping and location of the source/drain region 1606. Again, the processing shown in FIG. 16(a) is well known to those skilled in the art.

Figure 16B:
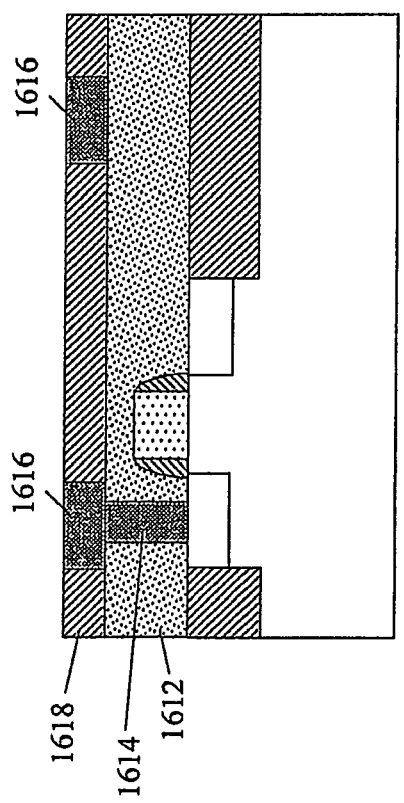
Figure 16C:
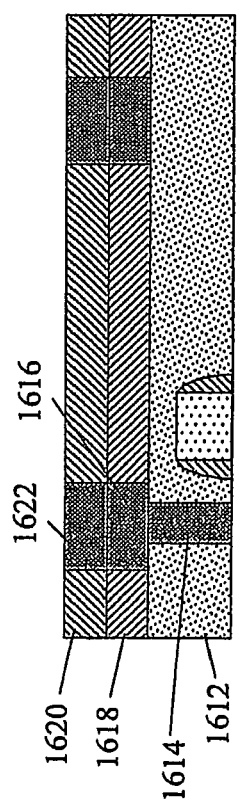

FIG. 16(b) illustrates additional standard CMOS processing, including formation of a first level dielectric layer 1612 over the substrate, transistor and STI regions. A metal contact 1614 formed within the dielectric layer 1612 provides electrical connection between one of the source/drain regions 1606 of the FET and a first level (M1) of metal wiring 1616 defined in another dielectric layer 1618 (e.g., silicon dioxide) atop dielectric layer 1612. Then, as shown in FIG. 16(c), still another dielectric layer 1620 (e.g., silicon nitride) is formed over dielectric layer 1618, with additional metal contacts 1622 connecting to the M1 wiring 1616. In order to simplify presentation of the figures, the substrate level of the device is omitted from FIG. 16(c) onward. In addition, the metal regions 1616 and 1622 are collectively designated by M1 hereinafter.

Figure 16D:
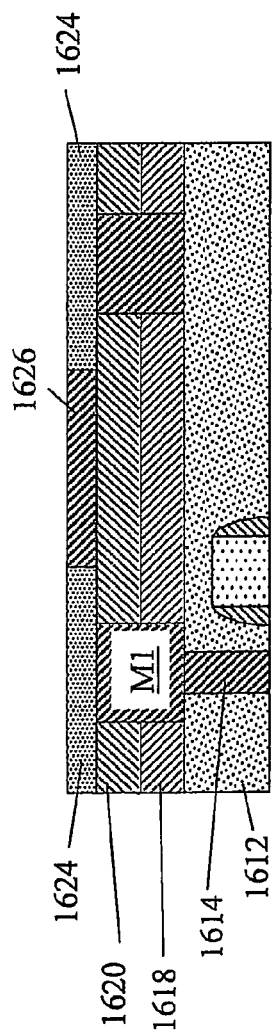
Figure 16E:
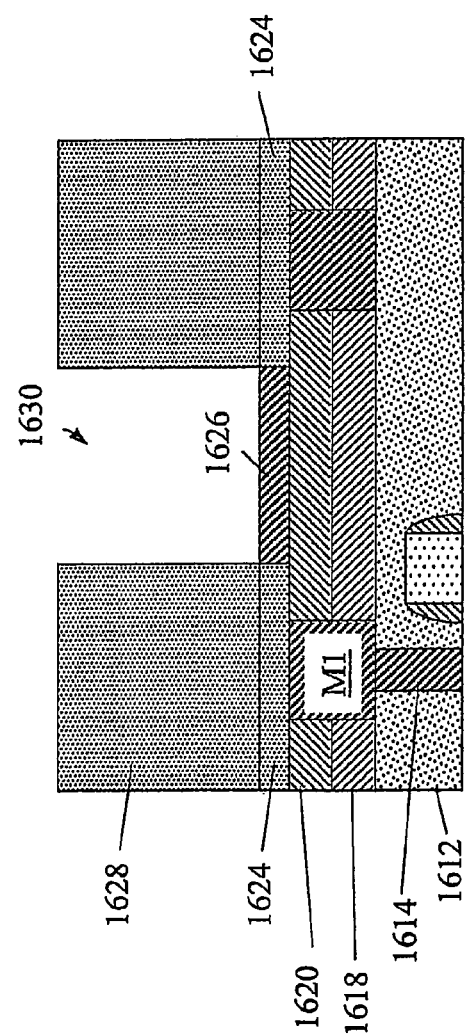
Figure 16F:
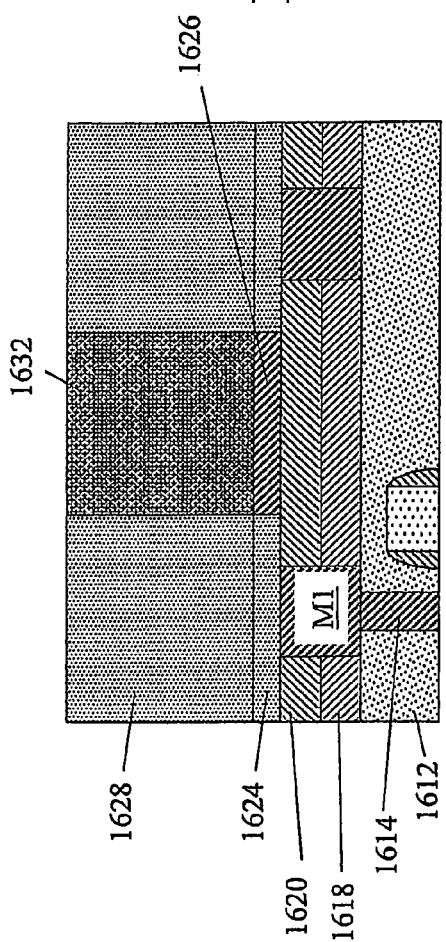

Proceeding to FIG. 16(d), a layer 1624 having a low Young's modulus (e.g., a low-K material) is formed over the M1 metal level, and is then patterned and filled and planarized with a bottom metal contact layer 1626 (e.g., tungsten) as described above. In contrast to surrounding layer 1624, the bottom metal contact layer 1626 has a higher Young's modulus (i.e., layer 1626 is harder than layer 1624). In addition, the bottom metal contact layer 1626 may also include a metal that will also act as an effective diffusion barrier (e.g., TiN, ZrN, $RuO_2$, etc.) to prevent any oxygen (or other element) diffusion from the piezoelectric layer above, as well as have a functional role in the device operation.

As then shown in FIG. 1(e), another low Young's modulus/low-K layer 1628 is formed, and patterned with an opening 1630 to define the location of a piezoelectric material. The piezoelectric material 1632 (e.g., PZT) is deposited and planarized in FIG. 16(f). It should be noted that where a low-K material is used for the low Young's modulus material, the deposition temperature conditions for the piezo material should be kept relatively low (e.g., [about 400° C.).

Figure 16G:
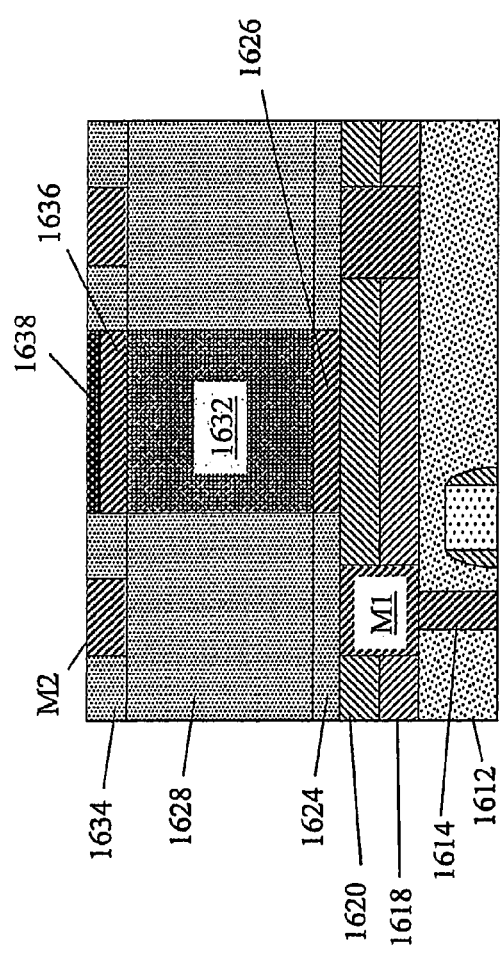
Figure 16H:
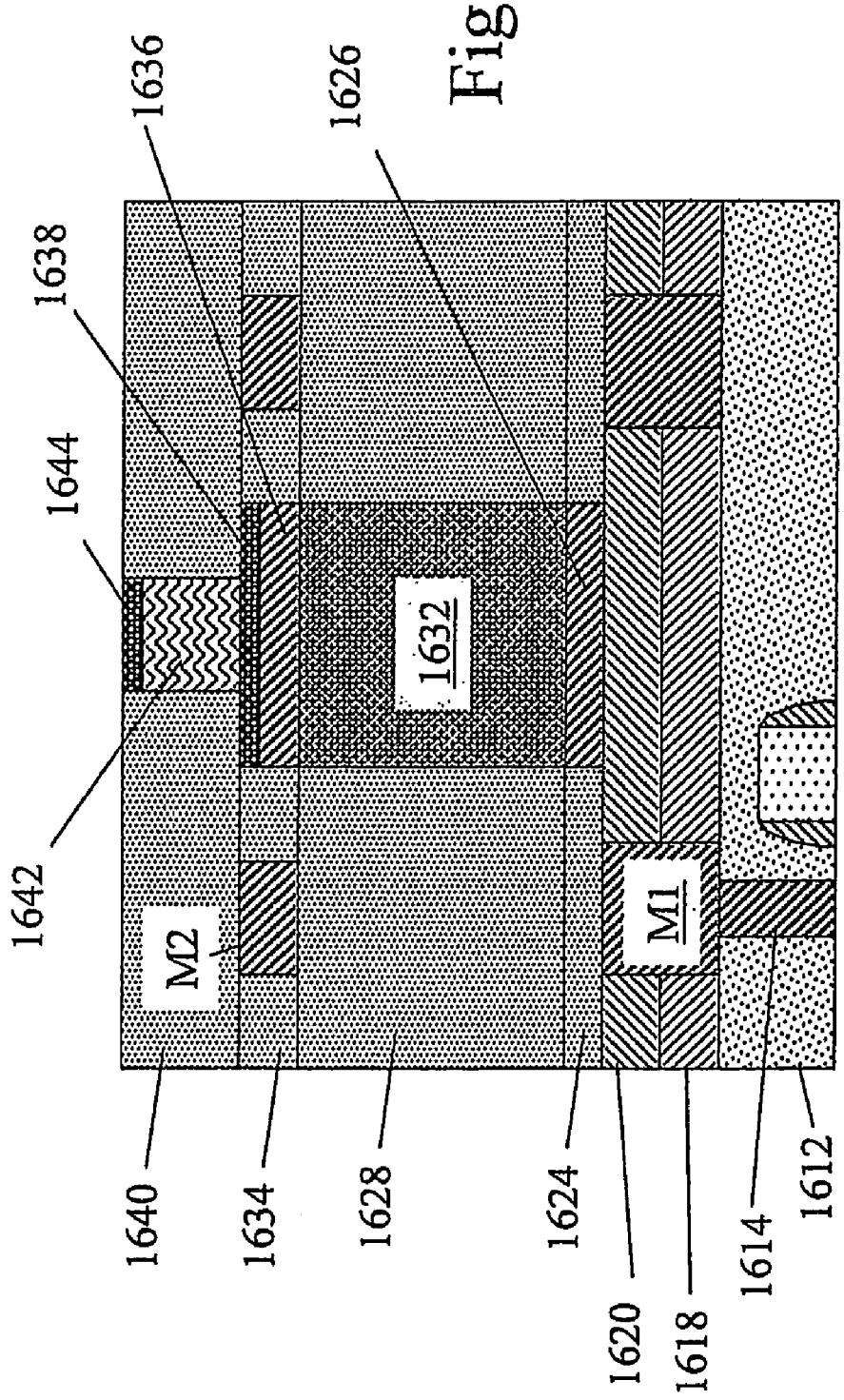

Then, as shown in FIG. 16(g), another layer 1634 of low Young's modulus/low-K material is deposited, followed by via definition for the M2 metal contacts and the middle contact metal layer 1636. In addition, the middle metal contact layer 1636 may also have a thin layer 1638 (e.g., 1-2 nm) of adhesion metal (e.g., TiN/Ti) for good adhesion between the metal contact layer 1636 and the subsequently formed PRHM. FIG. 16(h) illustrates the formation of the PRHM level, including deposition of another layer 1640 of low Young's modulus/low-K material, which is patterned to form an opening filled by the PRHM 1642 and another thin layer 1644 (e.g., 1-2 nm) of adhesion metal.

Figure 16I:
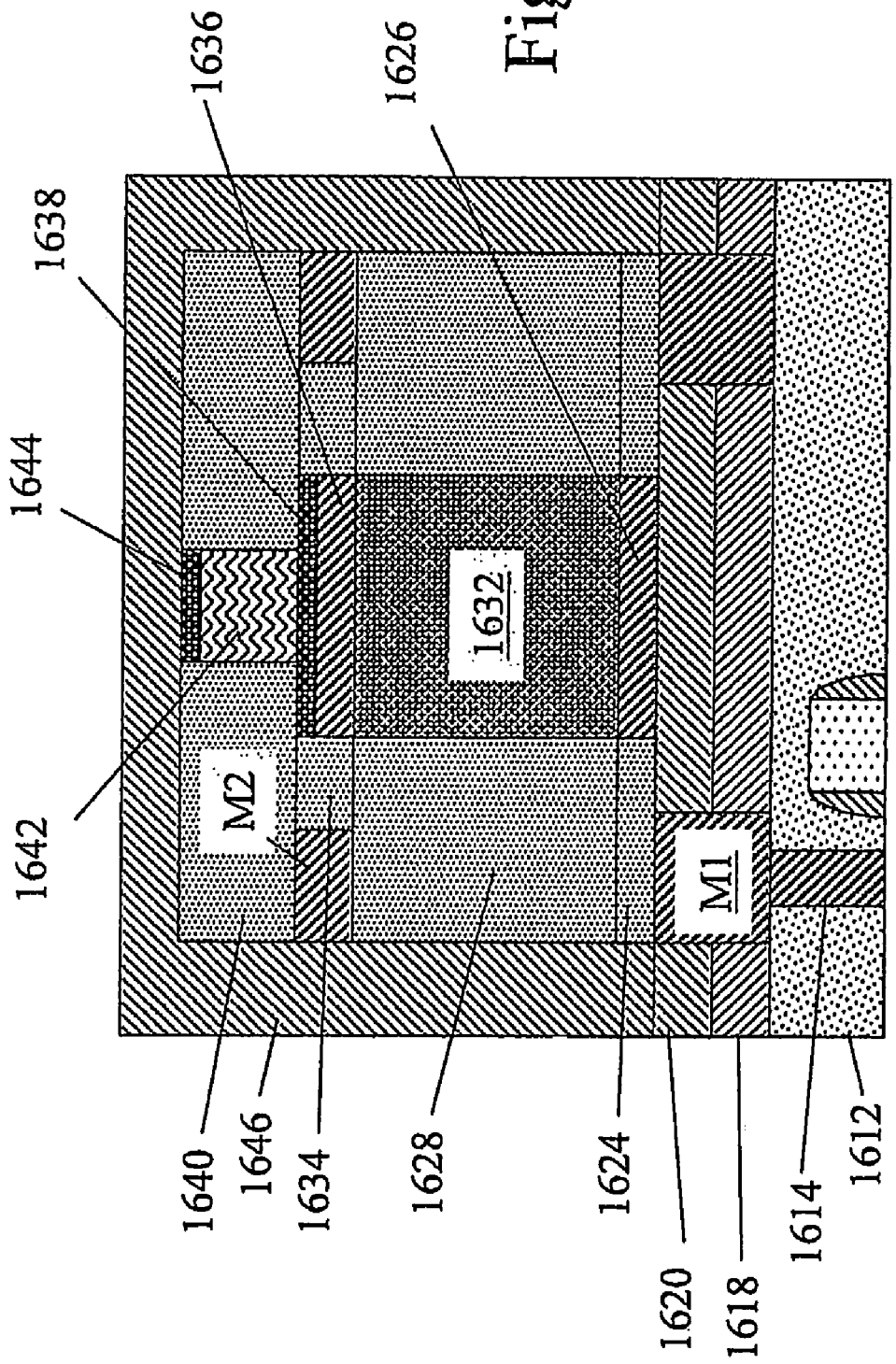
Figure 16J:
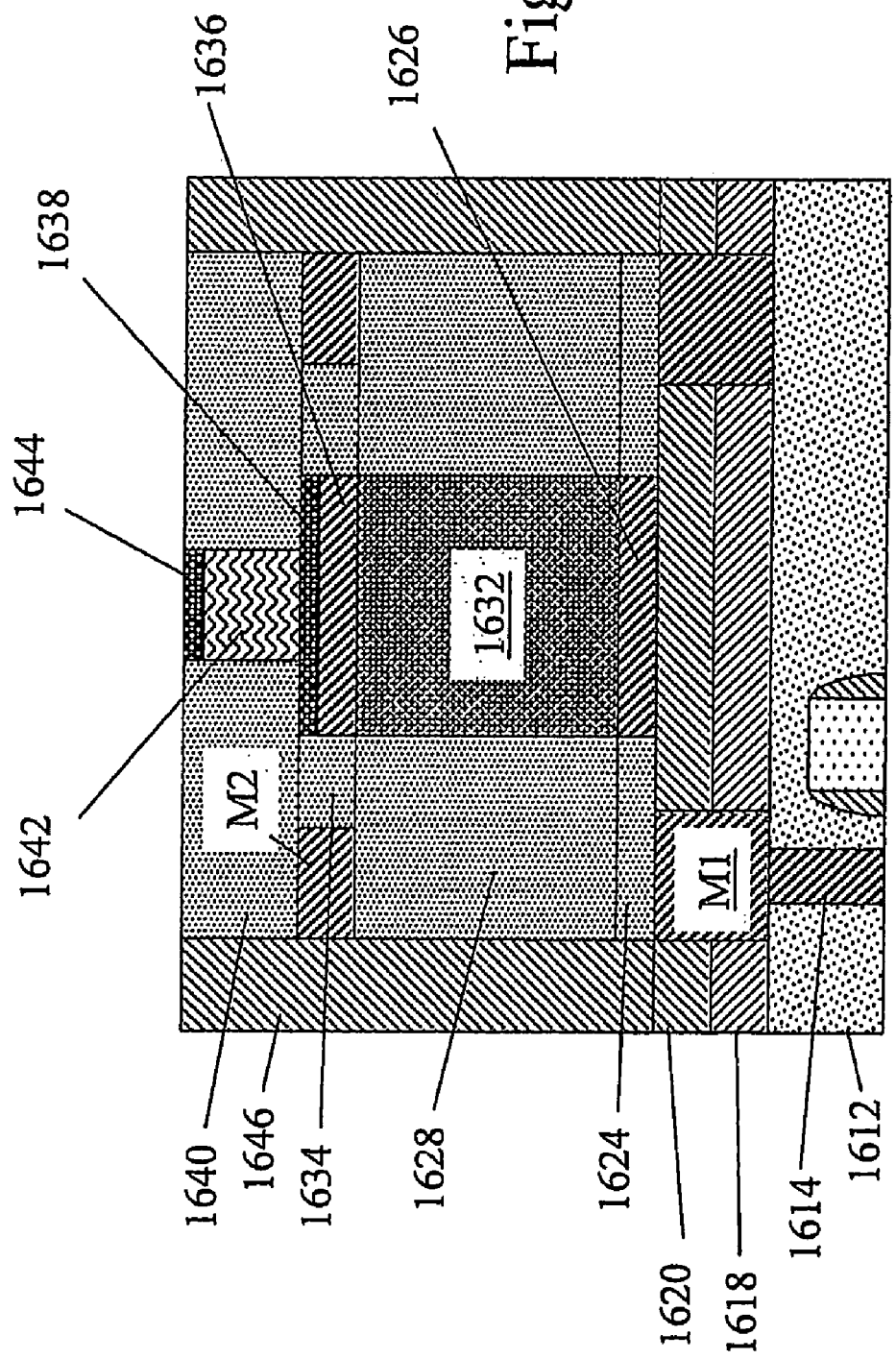
Figure 16K:
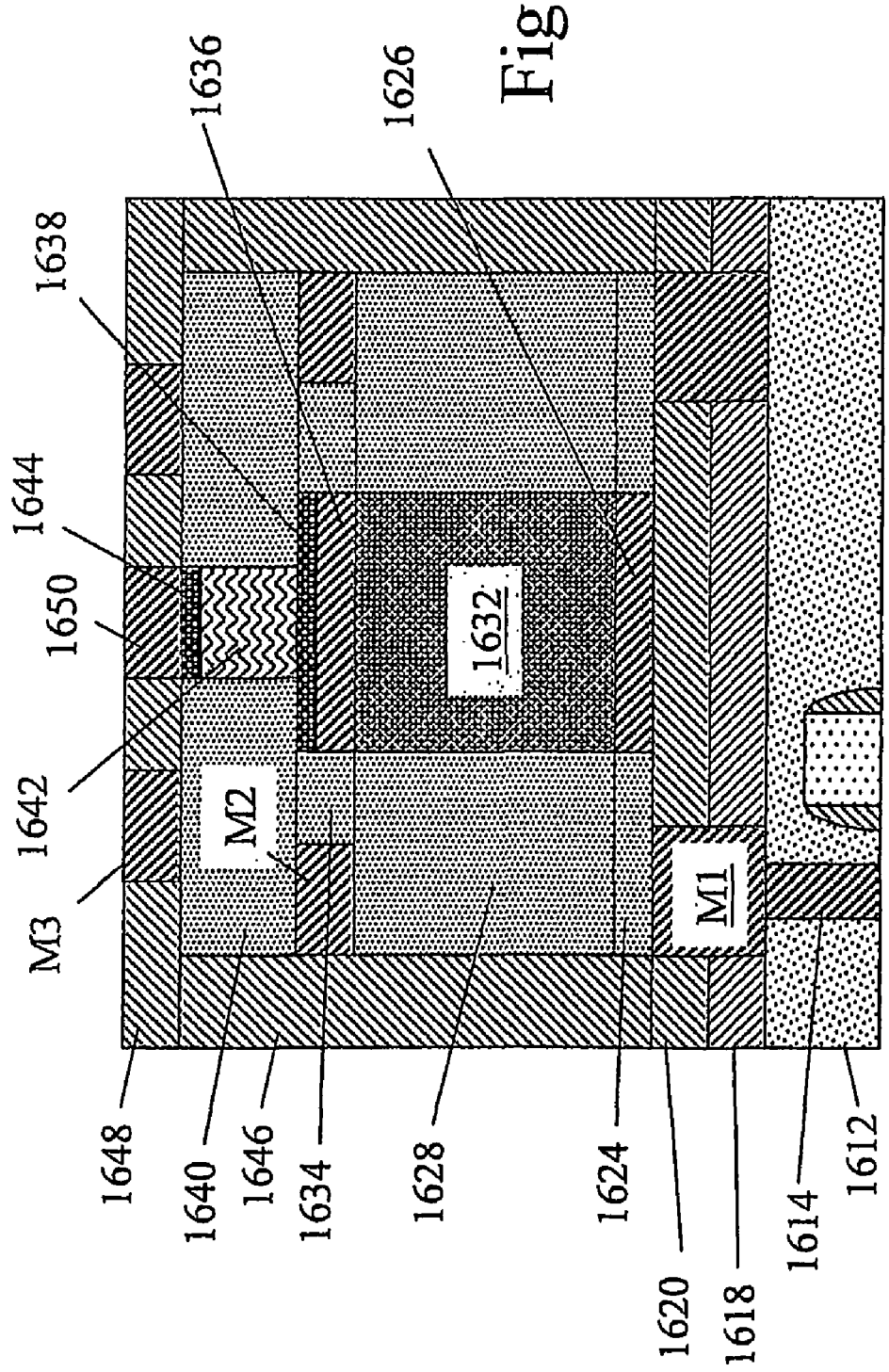
Figure 17:
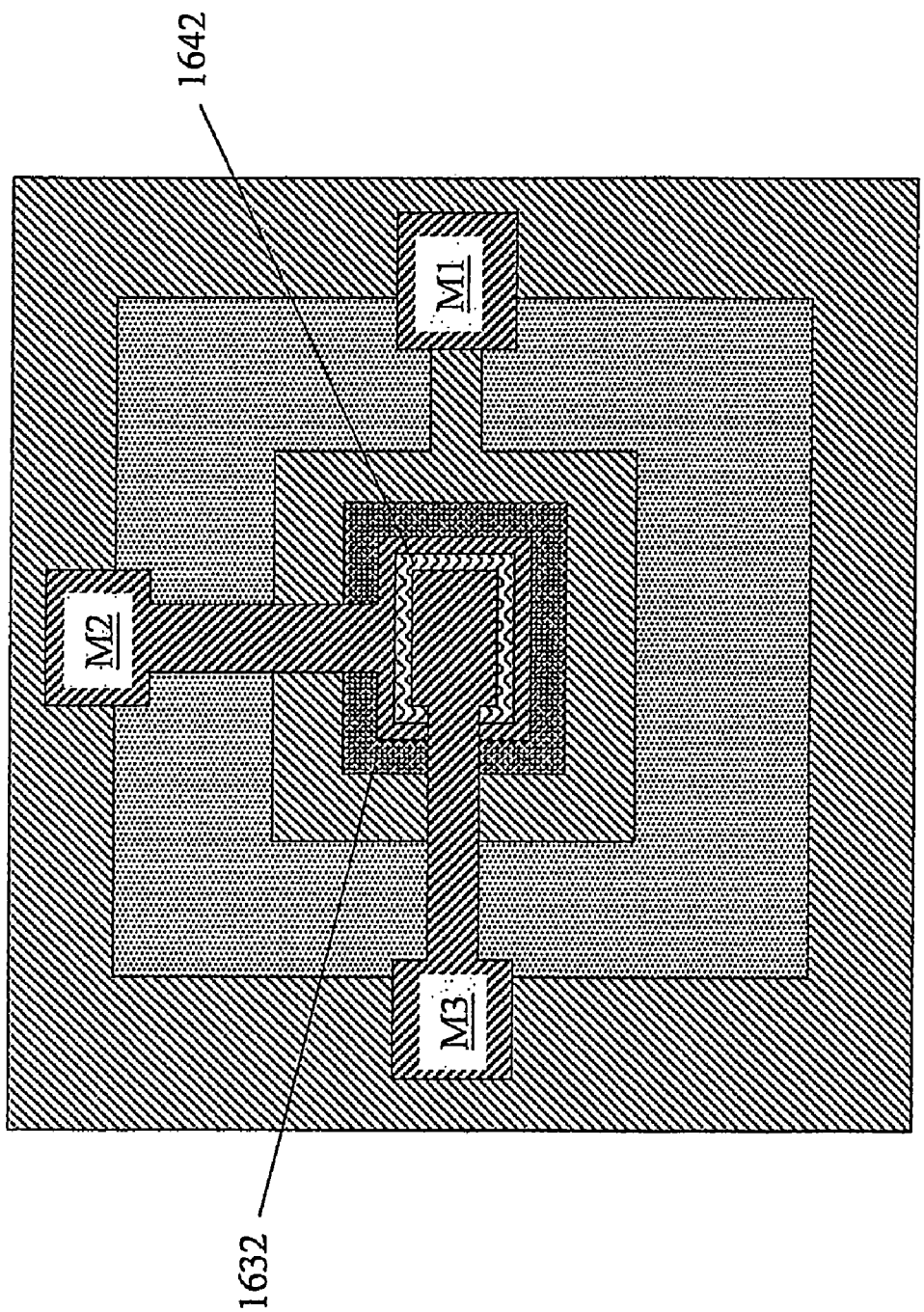
FIG. 17 is a top down view corresponding to the exemplary PRHM memory cell structure depicted in FIGS. 16(a) through 16(k).

Similar to the structure depicted in the simulation model of FIG. 12(a), a layer of surrounding dielectric 1646 (e.g., silicon nitride) is formed as shown in FIG. 16(i). This is accomplished by first patterning and etching portions of the multiple low Young's modulus/low-K layers (1624, 1628, 1634, 1640) and then depositing the nitride layer 1646 on the sidewalls of the structure. The structure is then planarized down to the top of low-K layer 1640 as shown in FIG. 16(j). Finally, in FIG. 16(k), another silicon nitride dielectric layer 1648 is deposited, followed by patterning and etching so as to form openings for filling by both M3 level metal contacts, as well as the top metal contact layer 1650, which upon planarization of the metal fill completes the piezoelectrically programmed, hysteretic memory cell structure. A top down view of the structure, particularly illustrating the relationship of the electrode contacts is show in FIG. 17.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A piezoelectrically programmed, non-volatile memory cell structure, comprising:

a programmable piezo-resistive hysteretic material (PRHM) that is capable of being interconverted between a low resistance state and high resistance state through applied pressure cycling thereto;

a piezoelectric material mechanically coupled to the PRHM such that an applied voltage across the piezoelectric material results in one of a tensile or compressive stress applied to the PRHM, depending upon the polarity of the applied voltage; and one or more electrodes in electrical communication with the PRHM, wherein the one or more electrodes are configured to provide a write programming current path through the piezoelectric material and a read current path through the PRHM, wherein:

the piezoelectric material is disposed between a first and a second of the electrodes;

the PRHM is disposed between the second and a third of the electrodes;

the write programming current path includes the first electrode, the piezoelectric material and the second electrode; and the read current path includes the third electrode, the PRHM and the second electrode.

2. The structure of claim 1, wherein the PRHM is a phase change material (PCM) that assumes an amorphous structure when pressure cycled to the high resistance state and a crystalline structure when pressure cycled to the low resistance state.

3. The structure of claim 2, wherein the PCM comprises a binary alloy of germanium (Ge) and antimony (Sb) having a composition $Ge_{0.15}Sb_{0.85}$.

4. The structure of claim 1, wherein the PRHM is samarium monosulfide (SmS).

5. The structure of claim 4, wherein the PRHM is subjected to a compressive bias pressure when not being programmed.

6. The structure of claim 1, wherein the piezoelectric material comprises one or more of: lead-zirconate-titanate (PZT), or strontium-doped lead-zirconate-titanate (PSZT).

7. The structure of claim 1, wherein an expansion induced in the piezoelectric material from an applied voltage of a first polarity results in a compressive stress applied to the PRHM, and a contraction from an applied voltage of a second opposite polarity results in a tensile stress applied to the PRHM.

8. The structure of claim 1, wherein the PRHM has a smaller surface area than the piezoelectric material.

9. The structure of claim 8, wherein the piezoelectric material is mechanically coupled to the PRHM by a buffer structure of a first dielectric material having a lower Young's modulus with respect to that of a more rigid, second dielectric clamp material surrounding the memory cell structure and the buffer structure.

10. The structure of claim 8, wherein the first dielectric material has a dielectric constant of about 4.0 or less.

11. The structure of claim 10, wherein the first dielectric material comprises SiCOH and the second dielectric material comprises silicon nitride.

12. The structure of claim 8, wherein the PRHM has a lower Young's modulus with respect to the piezoelectric material.

13. A non-volatile memory array, comprising:
a plurality of piezoelectrically programmed, non-volatile memory cells arranged in rows and columns, with each memory cell further comprising:
a programmable piezo-resistive hysteretic material (PRHM) that is capable of being interconverted between a low resistance state and high resistance state through applied pressure cycling thereto;
a piezoelectric material mechanically coupled to the PRHM such that an applied voltage across the piezoelectric material results in one of a tensile or compressive stress applied to the PRHM, depending upon the polarity of the applied voltage; and
one or more electrodes in electrical communication with the PRHM, wherein the one or more electrodes are configured to provide a write programming current path through the piezoelectric material and a read current path through the PRHM, wherein the piezoelectric material is disposed between a first and a second of the electrodes, the PRHM is disposed between the second and a third of the electrodes, the write programming current path includes the first electrode, the piezoelectric material and the second electrode, and the read current path includes the third electrode, the PRHM and the second electrode;

a plurality of read lines, each associated with a column of the array, with each read line coupled to the third electrode of each memory cell in the associated column;

a plurality of write lines, each associated with a column of the array, with each write line coupled to the first electrode of each memory cell in the associated column; and a plurality of common lines, each associated with a row of the array, with each common line coupled to the second electrode of each memory cell in the associated row.

14. The memory array of claim 13, further comprising a plurality of diodes coupling each read line to a corresponding third electrode.

15. The memory array of claim 13, wherein, during a write operation, a selected write line is coupled to a voltage above or below ground potential, at a magnitude less than a voltage threshold of the corresponding diode, and a selected common line is coupled to a voltage below or above ground potential, opposite the voltage of the write line, at a magnitude less than the voltage threshold of the corresponding diode, and wherein each read line, unselect write and common lines are grounded.

16. The memory array of claim 13, wherein, during a read operation, a selected common line is coupled to ground potential, each read line is coupled to a supply voltage value, and each unselected common line is coupled to the supply voltage value.

17. The memory array of claim 16, wherein the PRHM is a phase change material (PCM) that assumes an amorphous structure when pressure cycled to the high resistance state and a crystalline structure when pressure cycled to the low resistance state.

18. The memory array of claim 17, wherein the PCM comprises a binary alloy of germanium (Ge) and antimony (Sb) having a composition $Ge_{0.15}Sb_{0.85}$.

19. The memory array of claim 16, wherein the PRHM is samarium monosulfide (SmS).

20. A non-volatile memory array, comprising:
a plurality of piezoelectrically programmed, non-volatile memory cells arranged in rows and columns, with each memory cell further comprising:
a programmable piezo-resistive hysteretic material (PRHM) that is capable of being interconverted between a low resistance state and high resistance state through applied pressure cycling thereto;
a piezoelectric material mechanically coupled to the PRHM such that an applied voltage across the piezoelectric material results in one of a tensile or compressive stress applied to the PRHM, depending upon the polarity of the applied voltage; and
one or more electrodes in electrical communication with the PRHM, wherein the one or more electrodes are configured to provide a write programming current path through the piezoelectric material and a read current path through the PRHM, wherein the piezoelectric material is disposed between a first and a second of the electrodes, the PRHM is disposed between the second and a third of the electrodes, the write programming current path includes the first electrode, the piezoelectric material and the second electrode, and the read current path includes the third electrode, the PRHM and the second electrode;

a plurality of read/write lines, each associated with a column of the array, with each read/write line coupled to the first and third electrodes of each memory cell in the associated column;

a plurality of row enable lines, each associated with a row of the array, with each row enable line coupled to the second electrode of each memory cell in the associated row; and a switching transistor associated with each cell, the switching transistor configured to selectively couple the second electrode of the associated memory cell to ground.

21. The memory array of claim 20, wherein during a write operation, a selected read/write line is coupled to a first voltage above or below ground potential, depending upon the data to be written, and a selected row enable line is activated.

22. The memory array of claim 21, wherein during a read operation, a selected read/write line is coupled to a second voltage above ground potential, the magnitude of the second voltage less than the magnitude of the first voltage, and a selected row enable line is activated.

23. The memory array of claim 20, further comprising a pull down resistor in series between the PRHM and the read/write line.

24. A method of forming a piezoelectrically programmed, non-volatile memory cell structure, the method comprising:
forming a piezoelectric material between a first electrode and a second electrode;
forming a programmable piezo-resistive hysteretic material (PRHM) between the second electrode and a third electrode, the PRHM capable of being interconverted between a low resistance state and high resistance state through applied pressure cycling thereto;
wherein the piezoelectric material is mechanically coupled to the PRHM such that an applied voltage across the piezoelectric material results in one of a tensile or compressive stress applied to the PRHM, depending upon the polarity of the applied voltage; and
wherein the first and second electrodes are configured to provide a write programming current path through the piezoelectric material and the second and third electrodes are configured to provide a read current path through the PRHM.

* * * * *